United States Patent [19]
Shigehara et al.

[11] Patent Number: 6,084,431
[45] Date of Patent: *Jul. 4, 2000

[54] OUTPUT CIRCUIT PROVIDING PROTECTION AGAINST EXTERNAL VOLTAGES IN EXCESS OF POWER-SUPPLY VOLTAGE

[75] Inventors: Hiroshi Shigehara; Yoshihiro Iwamoto, both of Oita, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/757,562

[22] Filed: Nov. 27, 1996

[30] Foreign Application Priority Data

Dec. 26, 1996 [JP] Japan .................................. 7-338869

[51] Int. Cl.[7] .............................................. H03K 19/0185

[52] U.S. Cl. .................................. 326/81; 326/58; 326/86

[58] Field of Search .................................. 326/68, 80–81, 326/57–58, 83, 86, 112, 119, 121, 27

[56] References Cited

U.S. PATENT DOCUMENTS

| | | |
|---|---|---|
| 4,894,561 | 1/1990 | Nogami . |
| 5,144,165 | 9/1992 | Dhong et al. . |
| 5,151,619 | 9/1992 | Austin et al. . |
| 5,266,849 | 11/1993 | Kitahara et al. . |
| 5,276,364 | 1/1994 | Wellheuser . |
| 5,300,828 | 4/1994 | McClure . |
| 5,338,978 | 8/1994 | Larsen et al. . |
| 5,381,061 | 1/1995 | Davis ........................................ 326/57 |
| 5,381,062 | 1/1995 | Morris ....................................... 326/68 |
| 5,382,846 | 1/1995 | Shigehara et al. ........................ 326/68 |
| 5,406,140 | 4/1995 | Wert et al. . |
| 5,444,397 | 8/1995 | Wong et al. ............................... 326/81 |
| 5,467,031 | 11/1995 | Nguyen et al. ........................... 326/81 |
| 5,661,414 | 8/1997 | Shigehara et al. ........................ 326/81 |
| 5,721,508 | 2/1998 | Rees ......................................... 326/81 |

FOREIGN PATENT DOCUMENTS

| | | |
|---|---|---|
| 0498377A2 | 8/1992 | European Pat. Off. . |
| 0556605A2 | 8/1993 | European Pat. Off. . |
| 0620650A2 | 10/1994 | European Pat. Off. . |
| 0 668 658 A2 | 2/1995 | European Pat. Off. . |
| 4404132A1 | 8/1994 | Germany . |
| 7-230348 | 8/1995 | Japan . |
| 82258101A | 1/1993 | United Kingdom . |
| WO 92/09141 | 5/1992 | WIPO . |
| WO 94/18755 | 8/1994 | WIPO . |

OTHER PUBLICATIONS

Allmon et al., "WPM3.5: System, Process and Design Implications of a Reduced Supply Voltage Microprocessor," 1990 IEEE International Solid State Circuits Conference, Digest of Technical Papers, pp. 248, 249, 263, San Francisco, Feb. 14–16, 1990.

*Primary Examiner*—Jon Santamauro
*Attorney, Agent, or Firm*—Banner & Witcoff, Ltd.

[57] ABSTRACT

In a case where a plurality of outputs are connected and used, even when a voltage higher than the power-supply voltages inside the integrated circuit is applied to the signal output terminal, the reliability of the internal elements is prevented from deteriorating. The semiconductor integrated circuit includes a PMOS transistor that has its source potentially isolated from its back gate and has one end of the current path between its source and drain connected via a transistor switch to the signal output terminal. The integrated circuit generates a control signal having a value proportional to the voltage at one end of the current path between the source and drain of the PMOS transistor, supplies the generated control signal to the gate of the PMOS transistor, and controls the voltage of the control signal so that the potential difference between one end of the current path between the source and drain and the gate of the PMOS transistor may be within a desired range of values when the PMOS transistor is set in the on state by the control signal.

38 Claims, 9 Drawing Sheets

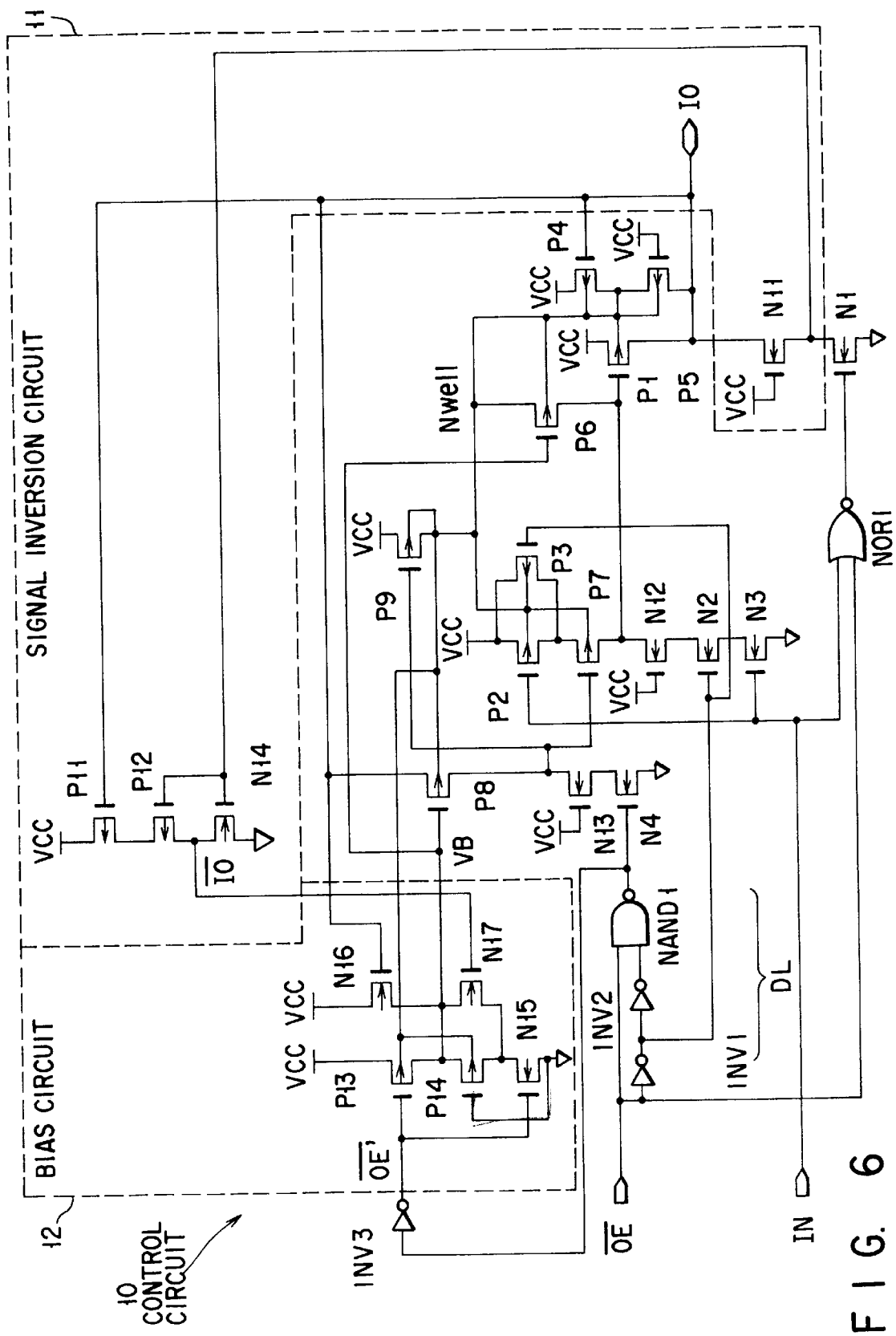
F I G. 6

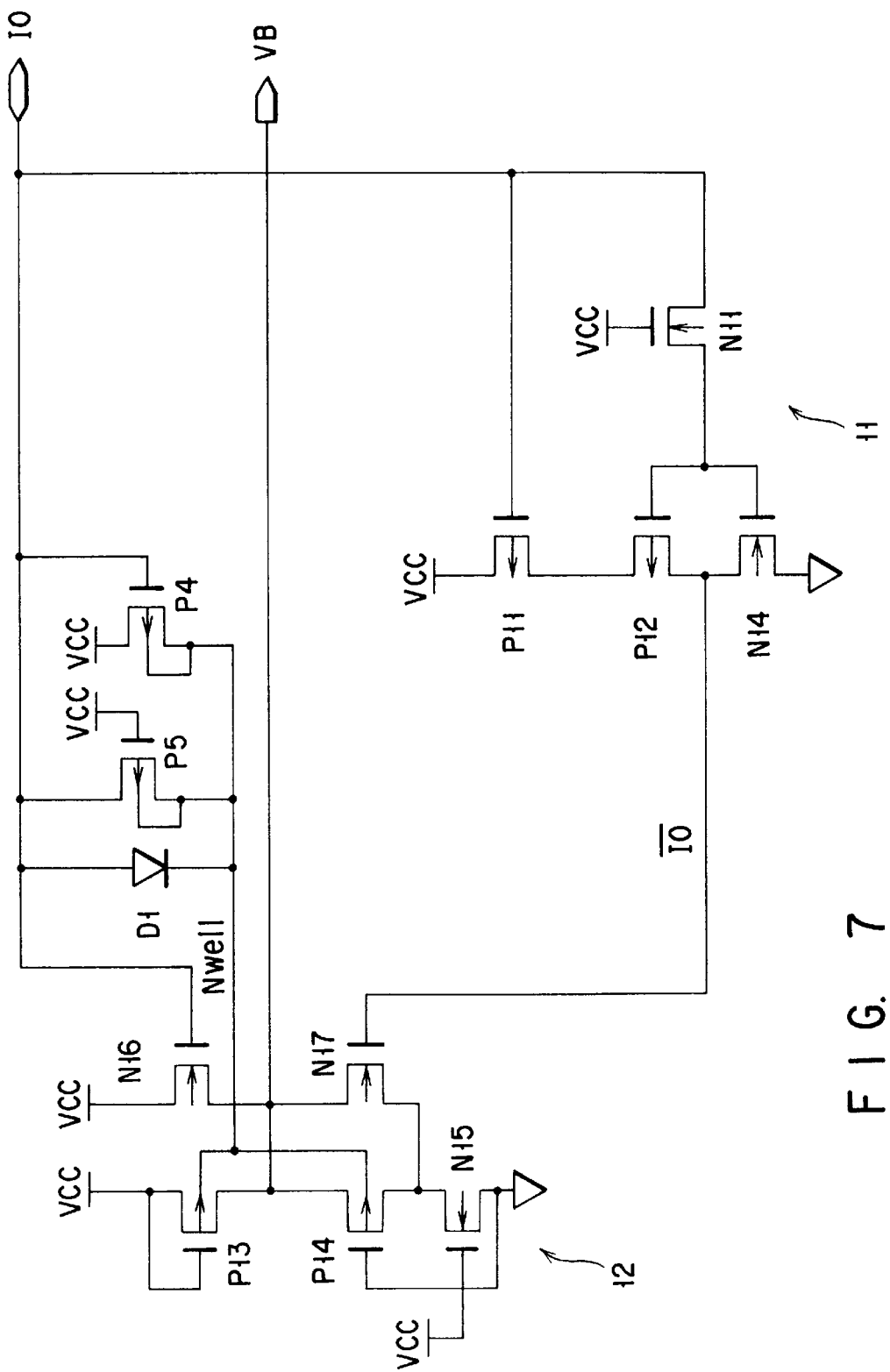
F I G. 7

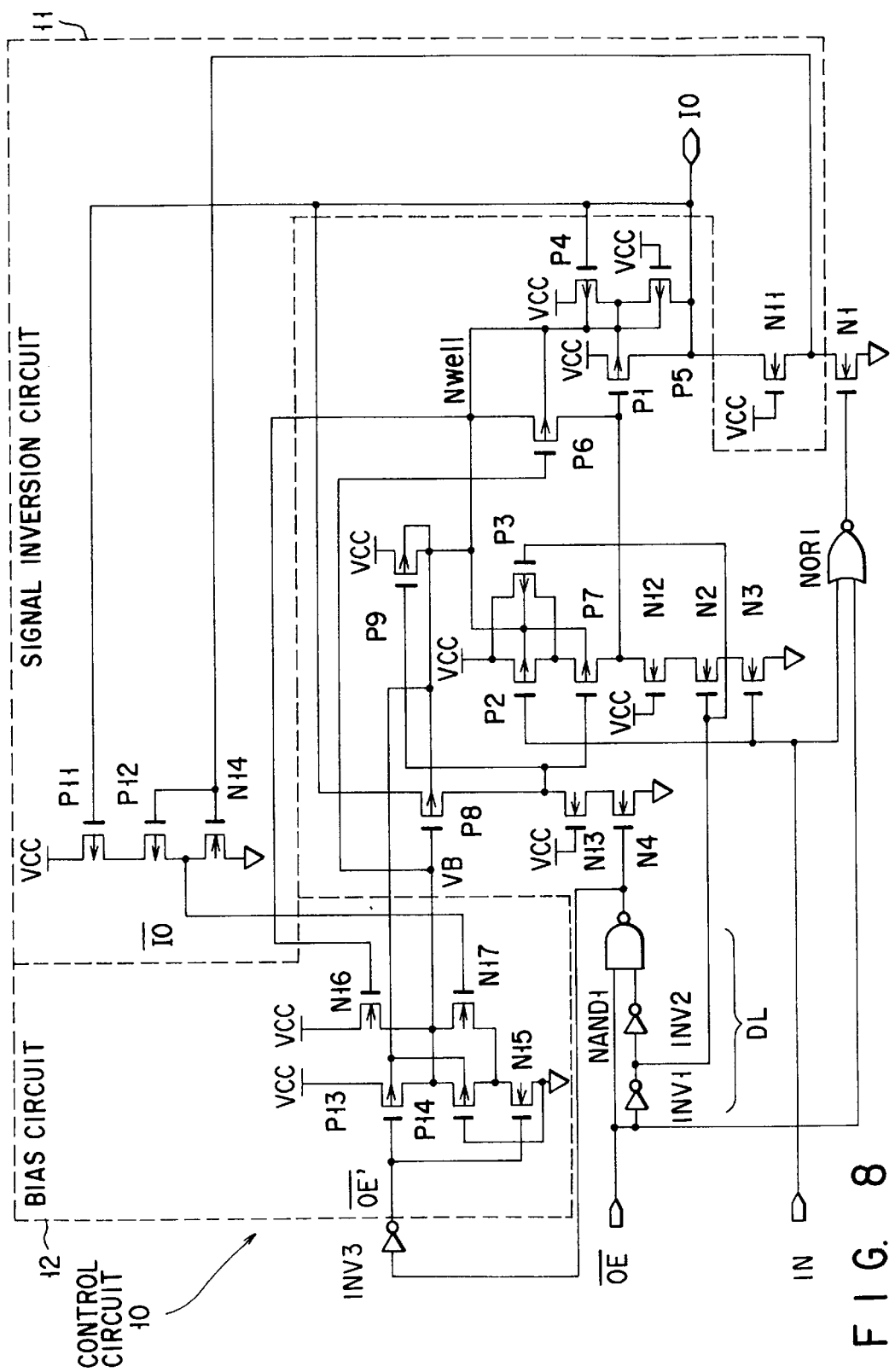
F I G. 8

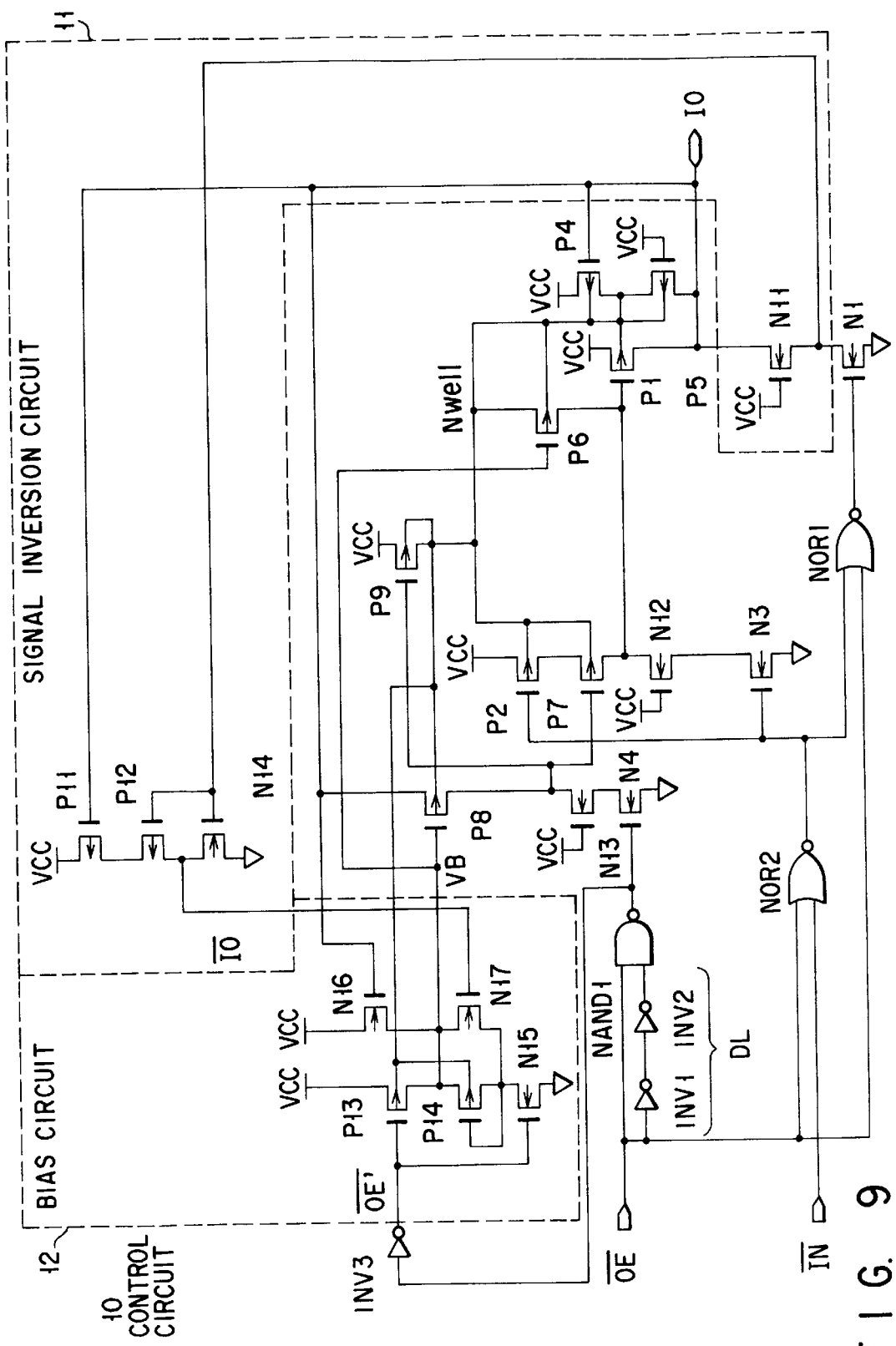
F I G. 9

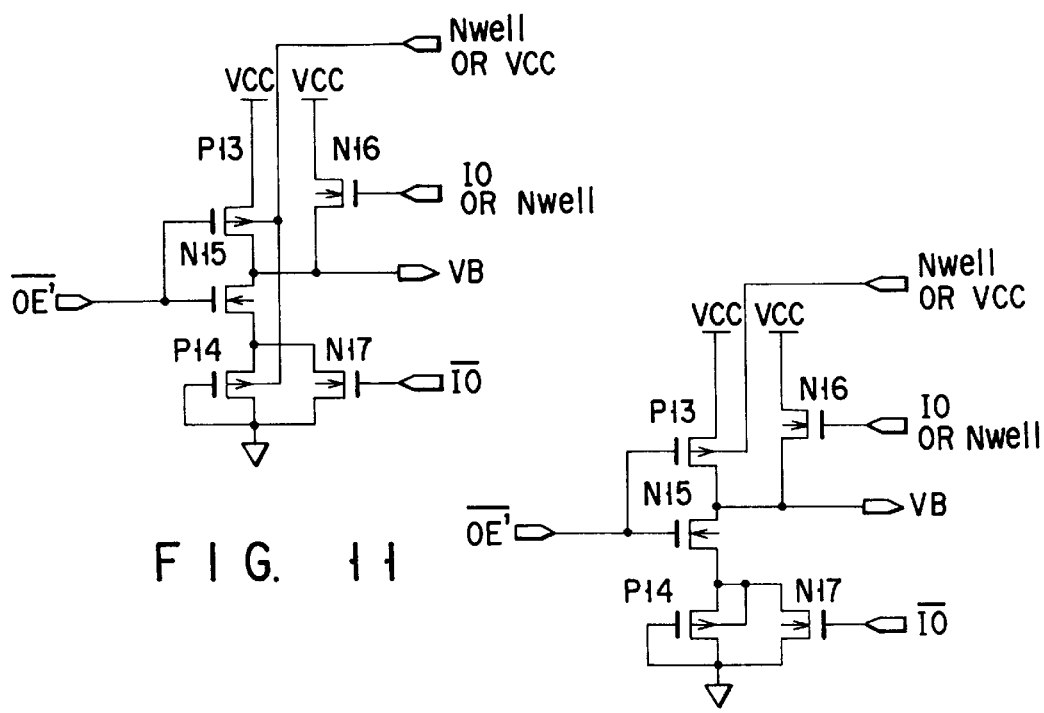
FIG. 11
FIG. 12
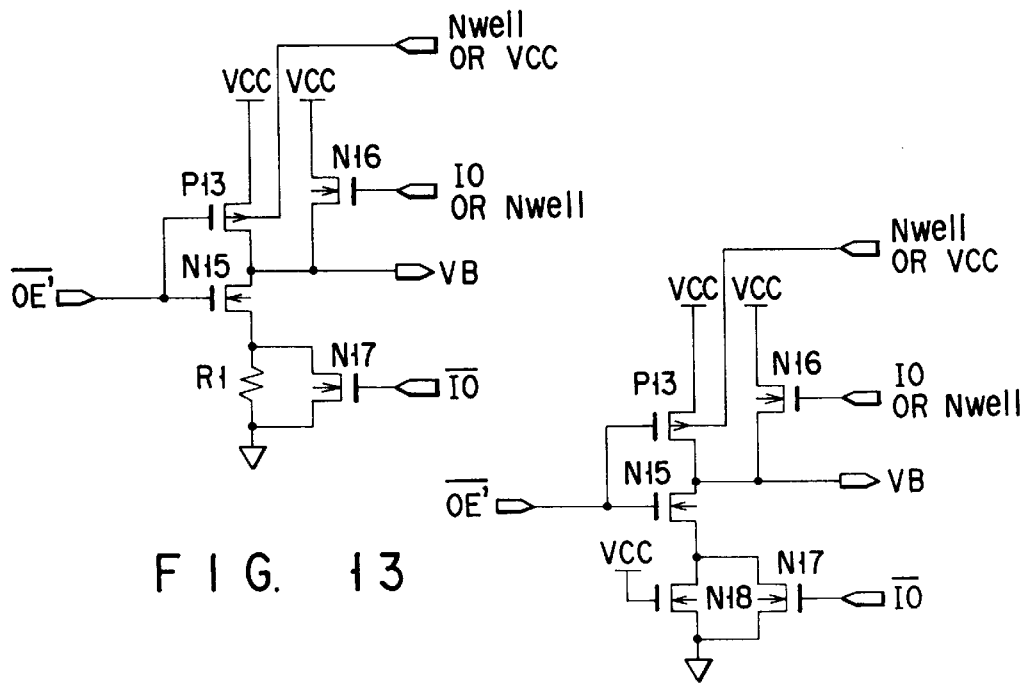
FIG. 13
FIG. 14

OUTPUT CIRCUIT PROVIDING PROTECTION AGAINST EXTERNAL VOLTAGES IN EXCESS OF POWER-SUPPLY VOLTAGE

BACKGROUND OF THE INVENTION

1. Field of the Invention

This invention relates to a semiconductor integrated circuit, and more particularly to a semiconductor integrated circuit provided with an output circuit that outputs a signal to the outside.

2. Description of the Related Art

With electronic equipment, such as computers, signals are transferred through a common bus line. FIG. 1 is a circuit diagram of a typical connection in a bus line application. To a bus line 500, the signal from each of two tristate buffers 501 and 502 serving as the output circuits of different semiconductor integrated circuits is outputted. When the enable signals EN1 and EN2 are activated, both of the tristate buffers output the signals corresponding to the input signals IN1 and IN2 onto the bus line 500, whereas when the enable signals EN1, EN2 are inactivated, the outputs are brought into a high impedance state. Here, it is assumed that separate power-supply voltages Vcc1 and Vcc2 differing in value are supplied to the tristate buffers 501 and 502, respectively. In one tristate buffer 501, a parasitic diode 503 is inserted between the power supply and the output node with the polarity as shown in the figure.

When CMOS tristate buffers are used as the two tristate buffers, a p-channel MOS transistor 511 and an n-channel MOS transistor 512 are provided in the output stage as shown in FIG. 2. The gate driving signal supplied to the p-channel MOS transistor 511 is formed by a NAND gate 514 to which an input signal IN (IN1 or IN2) and the output of an inverter 513 that inverts an enable signal EN (EN1 or EN2) are supplied. The gate driving signal supplied to the n-channel MOS transistor 512 is formed by a NOR gate to which the enable signal EN and the input signal IN are supplied. The p-type drain diffused layer of the p-channel MOS transistor 511 and the n-type drain diffused layer of the n-channel MOS transistor 512 are connected to an output node 516, thus forming a parasitic p-n junction diode 517 between the output node 516 and the back gate of the p-channel MOS transistor 511. The diode 517 is the parasitic diode 503 in FIG. 1.

Consider a case where in FIG. 1, one tristate buffer 502 outputs a high level signal and the other tristate buffer 501 is in the high impedance state at its output. In this case, if both of the power supply voltages Vcc1 and Vcc2 and the built-in voltage Vf of the p-n junction between the drain diffused layer and back gate of the p-channel MOS transistor satisfy Vcc1<Vcc2−Vf, the diode 503 will be brought into the forward bias state, permitting current I to flow from power supply Vcc2 to power supply Vcc1 via that diode as shown in FIG. 1.

To solve this problem, the applicant of the present invention has disclosed an output circuit improved so as to prevent such a current from flowing, in Japanese Patent Application No. 6-19432. The output stage of the output circuit related to the application is provided with a first p-channel MOS transistor for high-voltage output that has a source, a drain, a gate, and a back gate, with the source being potentially isolated from the back gate, an n-channel MOS transistor for low-voltage output, and a second p-channel MOS transistor that is inserted between the back gate and the gate of the first p-channel MOS transistor and functions as a switch for switching the back gate voltage of the first p-channel MOS transistor to the gate side. FIG. 3 shows a concrete circuit configuration of part of the output stage.

Between a power supply voltage Vcc and a signal output terminal IO, the current path between the source and drain of a first p-channel MOS transistor 601 for high voltage output is inserted, with the back gate (e.g., an n-well) of the transistor 601 being unconnected to the power supply voltage Vcc. Between the terminal IO and the ground voltage, the current path between the source and drain of an n-channel MOS transistor 602 for low voltage output is inserted. Between the back gate of the transistor 601 and the gate of the transistor 601, the current path between the source and drain of the p-channel MOS transistor 603 functioning as a switch is inserted. The transistor 603 has its gate connected to the ground voltage and is in the on state.

With the circuit constructed as shown in FIG. 3, because the source and back gate of the p-channel MOS transistor 601 are isolated potentially from each other, even if a higher voltage than the source voltage Vcc is applied to the terminal IO, current will not flow toward the source (the node of the power supply Vcc) via a p-n junction diode 604 existing parasitically between the drain (p-type diffused layer) and back gate (n-well) of the p-channel MOS transistor 601.

The diode 604 causes a voltage lower than the voltage of the terminal IO by the p-n junction built-in voltage of the diode 604 to appear at the back gate. This voltage is supplied to the gate of the transistor 601 via the transistor 603 functioning as a switch. As a result, the gate of the transistor 601 does not go to the floating state potentially. The value of the p-n built-in voltage is determined by the amount of a leakage current flowing from the node of the back gate to the ground. Since the leakage current is made small sufficiently, however, the built-in voltage is sufficiently smaller than the absolute value of the threshold voltage of the transistor 601, bringing the transistor 601 into the off state. Consequently, current will flow through neither the transistor 601 nor the diode 604 from the terminal IO to Vcc node.

As device miniaturization has progressed further, however, a new problem has arisen as follows. With the progress of device miniaturization, the breakdown voltage of the MOS transistor tends to get lower. At present, processing techniques recommending 5-V power-supply voltage operation (hereinafter, referred to as 5-V processing) are being replaced with processing techniques recommending 3.3-V power-supply voltage operation (hereinafter, referred to as 3.3-V processing). With this backdrop, the number of hybrid 5-V and 3.3-V systems is increasing.

In the case of devices manufactured by the 5-V processing, use of the circuit techniques in the previous application makes it unnecessary to consider the breakdown problem. When the circuit techniques in the previous application are applied to the devices manufactured by the 3.3-V processing, however, a 5-V signal can be applied between the gate and drain or source of the MOS transistor unless a suitable measure is taken, introducing the danger of degrading the reliability of the transistor. For instance, in the circuit of FIG. 3, since the gate of the transistor 603 is connected to the ground voltage, the potential difference between the gate and the terminal IO is 5V when a voltage of 5V is applied to the terminal IO, introducing the danger of impairing the reliability of the transistor 603.

The problem with the previous application will be explained using a concrete circuit. FIG. 4 shows the configuration of an embodiment of the output circuit in the previous application. The basic configuration of the output circuit is such that the output stage is composed of a p-channel and n-channel MOS transistors and the stage that generates driving signals for driving the gates of both of the transistors is composed of a NAND circuit, a NAND gate, a NOR gate, and an inverter.

The drains of the p-channel MOS transistor (hereinafter, referred to as the PMOS transistor) P1 and the n-channel MOS transistor (hereinafter, referred to as the NMOS transistor) N1 are both connected to the terminal IO. The source of the PMOS transistor P1 is connected to the power-supply voltage Vcc and the source of the NMOS transistor N1 is connected to the ground voltage.

When a PMOS transistor P7 is on, PMOS transistors P2 and P3 and NMOS transistors N2 and N3 constitute a NAND circuit that generates a gate driving signal for the PMOS transistor P1. Specifically, the source of PMOS transistor P2 is connected to that of PMOS transistor P3 to form a common source. The drain of PMOS transistor P2 is connected to that of PMOS transistor P3 to form a common drain, which is connected to the gate of the PMOS transistor P1. Between the gate of PMOS transistor P1 and the ground voltage, the current path between the drain and source of NMOS transistor N2 and the current path between the drain and source of NMOS transistor N3 are connected in series. The gate of PMOS transistor P2 is connected to the gate of NMOS transistor N3 to form a common gate, to which an input signal IN is supplied. The gate of PMOS transistor P3 is connected to the gate of NMOS transistor N2 to form a common gate, to which an output enable signal /OE is supplied via an inverter INV1.

A NOR gate NOR1 is supplied with the output enable signal /OE and the input signal IN and generates a gate driving signal for the NMOS transistor N1.

The output of the inverter INV1 is supplied to a NAND gate NAND1 via an inverter INV2. The NAND gate NAND1 is supplied with the signal /OE. The inverters INV1 and INV2 and NAND gate NAND1 constitute a delay circuit DL that delays the signal /OE for a specified period of time.

To the back gate of the PMOS transistor P1, the drain and back gate of PMOS transistor P4 are connected. The PMOS transistor P4 has its source connected to the power-supply voltage Vcc and its gate connected to the terminal IO. The PMOS transistor P4 is on when the terminal IO is at the low level, thereby supplying the power-supply voltage Vcc to the back gate of PMOS transistor P1.

To the back gate of the PMOS transistor P1, the drain and back gate of the PMOS transistor P5 are connected. The PMOS transistor P5 has its source connected to the terminal IO and its gate connected to the power-supply voltage Vcc. The PMOS transistor P5 is on when the voltage at the terminal IO is more than a specified value higher than the power-supply voltage Vcc, thereby supplying the voltage at the terminal IO to the back gate of the PMOS transistor P1.

Between the back gate and gate of the PMOS transistor P1, the current path between the source and drain of PMOS transistor P6 is connected. The PMOS transistor P6 corresponds to the transistor 603 in FIG. 3. The output of the NAND gate NAND1 provides on/off control of the PMOS transistor P6. When being turned on, the PMOS transistor P6 allows the voltage at the back gate of PMOS transistor P1 to be outputted to the gate side.

To the common source of the PMOS transistors P2 and P3, the drain of the PMOS transistor P7 is connected. The source of the PMOS transistor P7 is connected to the power-supply voltage Vcc.

In response to the output of the NAND gate NAND1, a PMOS transistor P8 and an NMOS transistor N4 generate a control signal according to the ground voltage and the voltage at the terminal IO. The source of PMOS transistor P8 is connected to the terminal IO. The drain of PMOS transistor P8 is connected to that of NMOS transistor N4 to form a common drain and the gate of PMOS transistor P8 is connected to that of NMOS transistor N4 to form a common gate. The source of NMOS transistor N4 is connected to the ground voltage.

The current path between the source and drain of a PMOS transistor P9 is connected between the power-supply voltage Vcc and the back gate of the PMOS transistor P1. The signal at the common drain of the PMOS transistor P8 and NMOS transistor N4 is supplied to the gates of both of the PMOS transistors P7 and P9.

With the circuit thus constructed, when the output enable signal /OE is at Vcc, or at the high level, the signal output terminal IO is in a high impedance state. At this time, the gates of the NMOS transistors N1, N2, and N4 are at the ground voltage. Since the output of the NAND gate NAND1 is at the ground voltage, the gates of PMOS transistors P6 and P8 are at the ground voltage.

Here, it is assumed that a voltage higher than Vcc (3.3V), for example, 5V, is applied to the terminal IO. In this case, a voltage difference of 5V is consequently applied between the gates and drains of the NMOS transistor N1, N2, N4, introducing the danger of degrading the reliability of these NMOS transistors. A potential difference of 5V is also applied between the gates and sources of the PMOS transistors P6 and P8, introducing the danger of degrading the reliability of these PMOS transistors. In addition, the potential of 5V is applied to the node at the gate of the PMOS transistor P1 via PMOS transistor P6. Since the gate voltage of the PMOS transistor P3 is the ground voltage, a potential difference of 5V is also applied between the gate and source of the PMOS transistor P3. When the input signal IN is set at the ground voltage, the same problem arises on the PMOS transistor P2 side.

FIG. 5 shows the configuration of another embodiment of the output circuit in the previous application. The circuit of FIG. 5 differs from the circuit of FIG. 4 in that a NAND gate NAND2 is provided in place of the NAND circuit composed of the PMOS transistors P2 and P3 and NMOS transistors N2 and N3 and the PMOS transistor P7 supplying the Vcc potential to the NAND circuit and in that a CMOS transfer gate composed of a PMOS transistor P10 and an NMOS transistor N5 is provided between the output node of the NAND gate NAND2 and the gate of the PMOS transistor P1. The gate of the PMOS transistor P10 constituting the transfer gate is connected to the common drain of the PMOS transistor P8 and NMOS transistor N4. The gate of NMOS transistor N5 is connected to the output node of the NAND gate NAND1.

With the circuit thus constructed, when the output enable signal /OE is at Vcc, or at the high level, the signal output terminal IO is in the high impedance state. At this time, the gates of the NMOS transistors N1, N4, and N5 are at the ground voltage. Since the output of the NAND gate NAND1 is at the ground voltage, the gates of the PMOS transistors P6 and P8 are at the ground voltage.

Here, it is assumed that a voltage higher than Vcc (3.3V), for example 5V, is applied to the terminal IO. In this case, a potential difference of 5V is consequently applied between the gates and drains of the NMOS transistors N1, N4, and N5, introducing the danger of degrading the reliability of these NMOS transistors. A potential difference of 5V is also applied between the gates and sources of the PMOS transistors P6 and P8, introducing the danger of degrading the reliability of these PMOS transistors.

As has been explained by reference to FIGS. 4 and 5, the circuit in the previous application causes the problem that a potential difference exceeding the breakdown voltage is applied between the gate and drain of the transistor, thus impairing the reliability, when a higher voltage (e.g., 5V) signal is applied to the output terminal of a circuit produced by low-breakdown voltage processing, such as 3.3-V processing.

SUMMARY OF THE INVENTION

Measures are taken to prevent current from flowing between the power supplies even in a case where a plurality of output circuits are connected to a bus line and are supplied with power-supply voltages differing in value. Semiconductor integrated circuits for which such measures have been taken and whose elements have been miniaturized, encounter the problem that the reliability of the internal elements is impaired when a signal whose voltage is higher than the power supply voltages inside the integrated circuit is applied to the signal output terminal.

The present invention has been made, taking into account the above-described disadvantages. The object of the present invention is to provide a semiconductor integrated circuit that prevents not only current from flowing between the power supplies even when power-supply voltages differing in value are supplied in a case where a plurality of outputs are connected and used, but also the reliability of the internal elements from being degraded even when a voltage higher than the power-supply voltages inside the integrated circuit is applied to the signal output terminal.

A semiconductor integrated circuit of the present invention is characterized by comprising: a signal output terminal; a first MOS transistor which has a source, a drain, a gate, and a back gate, the source being potentially isolated from the back gate, and one end of the current path between the source and drain being connected directly or via a switch element to the signal output terminal; and a control circuit which generates a control signal having a value proportional to the voltage at the signal output terminal or the voltage at one end of the current path between the source and drain of the first MOS transistor, supplies the generated control signal to the gate of the first MOS transistor, and controls the voltage of the control signal so that the potential difference between one end of the current path between the source and drain and the gate of the first MOS transistor may be within a desired range of values when the first MOS transistor is set in the on state by the control signal.

A semiconductor integrated circuit of the present invention is characterized by comprising: a signal output terminal; a first MOS transistor for signal output which has a source, a drain, a gate, and a back gate, the source being connected to a first reference voltage, the drain being connected to the signal output terminal, and the source being potentially isolated from the back gate; a second MOS transistor of the same conductivity type as that of the first MOS transistor which has a source, a drain, a gate, and a back gate, the source being connected to the back gage of the first MOS transistor and the drain being connected to the gate of the first MOS transistor; and a control circuit which generates a control signal having a value proportional to the voltage at the signal output terminal, supplies the generated control signal to the gate of the second MOS transistor, and controls the voltage of the control signal so that the potential difference between the source and gate of the second MOS transistor may be within a desired range of values when the second MOS transistor is set in the on state by the control signal.

A semiconductor integrated circuit of the present invention is characterized by comprising: a signal output terminal; a first MOS transistor which has a source, a drain, a gate, and a back gate, the source being connected to a first reference voltage, the drain being connected to the signal output terminal, and the source being potentially isolated from the back gate; a second MOS transistor of the same conductivity type as that of the first MOS transistor which has a source, a drain, a gate, and a back gate, the source being connected to the back gage of the first MOS transistor and the drain being connected to the gate of the first MOS transistor; a first control circuit which generates a first control signal having a value proportional to the voltage at the signal output terminal, supplies the generated control signal to the gate of the second MOS transistor, and controls the voltage of the first control signal so that the potential difference between the source and gate of the second MOS transistor may be within a desired range of values when the second MOS transistor is set in the on state by the first control signal; a second control circuit one end of which is connected to the first reference voltage and which generates a second control signal that sets the first MOS transistor in the off state according to a plurality of control input signals; a third MOS transistor of the same conductivity as that of the first MOS transistor which has a source, a drain, a gate, and a back gate, the current path between the source and drain being inserted between the output node of the second control signal and the gate of the first MOS transistor, and the back gate being connected to the back gate of the first MOS transistor to form a common back gate; and a fourth MOS transistor of the same conductivity as that of the first MOS transistor which has a source, a drain, a gate, and a back gate, the current path between the source and drain being inserted between the signal output terminal and the gate of the third MOS transistor, the back gate being connected to the back gate of the first MOS transistor to form a common back gate, and the gate being supplied with the first control signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a circuit diagram of the output circuit in a semiconductor integrated circuit according to a first embodiment of the present invention;

FIG. 7 is an equivalent circuit diagram of part of the circuit of FIG. 6;

FIG. 8 is a circuit diagram of the output circuit in a semiconductor integrated circuit associated with a first modification of the first embodiment;

FIG. 9 is a circuit diagram of the output circuit in a semiconductor integrated circuit associated with a second modification of the first embodiment;

FIG. 11 is another circuit diagram of the control circuit used in the semiconductor integrated circuit associated with each of the above embodiments;

FIG. 12 is still another circuit diagram of the control circuit used in the semiconductor integrated circuit associated with each of the above embodiments;

FIG. 13 is still another circuit diagram of the control circuit used in the semiconductor integrated circuit associated with each of the above embodiments; and FIG. 14 is still another circuit diagram of the control circuit used in the semiconductor integrated circuit associated with each of the above embodiments.

DETAILED DESCRIPTION OF THE PREFERRED EMBODIMENTS

Figure 1:
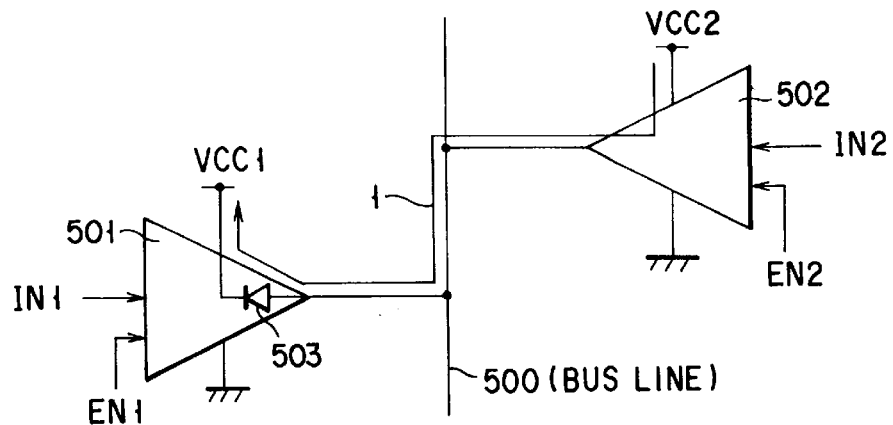
FIG. 1 is a circuit diagram of an example of a typical connection in a bus line application.
Figure 2:
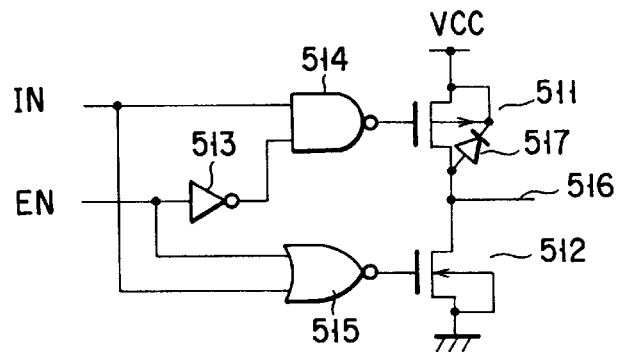
FIG. 2 is a detailed circuit diagram of a tristate buffer used in the circuit of FIG. 1.
Figure 3:
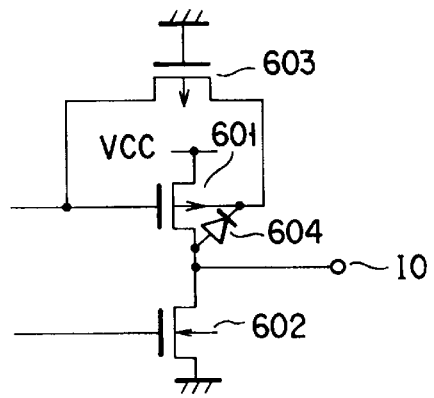
FIG. 3 is a circuit diagram of the output stage in an output circuit related to the previous invention.

Hereinafter, referring to the drawings, the present invention will be explained by the use of the preferred embodiments.

FIG. 6 shows the configuration of the output circuit in a semiconductor integrated circuit according to a first embodiment of the present invention. Except for part of the circuit, the output circuit has a similar configuration to that of the circuit associated with the previous application shown in FIG. 4, so explanation will be given with the same parts as those in FIG. 4 being indicated by the same reference symbols. The circuit of FIG. 6 differs greatly from the circuit of FIG. 4 in that a control circuit 10 is added which is composed of a signal inversion circuit 11 and a bias circuit 12 and which is supplied with the signal voltage at the signal output terminal IO and generates a control signal according to the signal voltage. The control circuit will be explained in detail later.

A PMOS transistor P1 in the output stage has its source connected to a power-supply voltage Vcc and its drain connected to a signal output terminal IO. The drain of an NMOS transistor N1 in the output stage is connected to the terminal IO via the current path between the source and drain of an NMOS transistor N11 in the control circuit 10. The gate of the NMOS transistor N11 is connected to the power-supply voltage Vcc. Specifically, the output stage differs from that of the circuit of FIG. 4 in that the NMOS transistor N11 is added.

When a PMOS transistor P7 is on, PMOS transistors P2 and P3 and NMOS transistors N2 and N3 constitute a NAND circuit that generates a gate driving signal for the PMOS transistor P1. Differently from the circuit of FIG. 4, the common source of the PMOS transistors P2 and P3 is connected to the power-supply voltage Vcc side and the current path between the source and drain of the PMOS transistor P7 is connected between the common drain side of the PMOS transistor P2, P3 and the gate of the PMOS transistor P1 in the output stage. Furthermore, an NMOS transistor N12 whose gate is connected to the power-supply voltage Vcc is added between the drain of the NMOS transistor N2 and the gate of the PMOS transistor P1 in the output stage.

Figure 4:
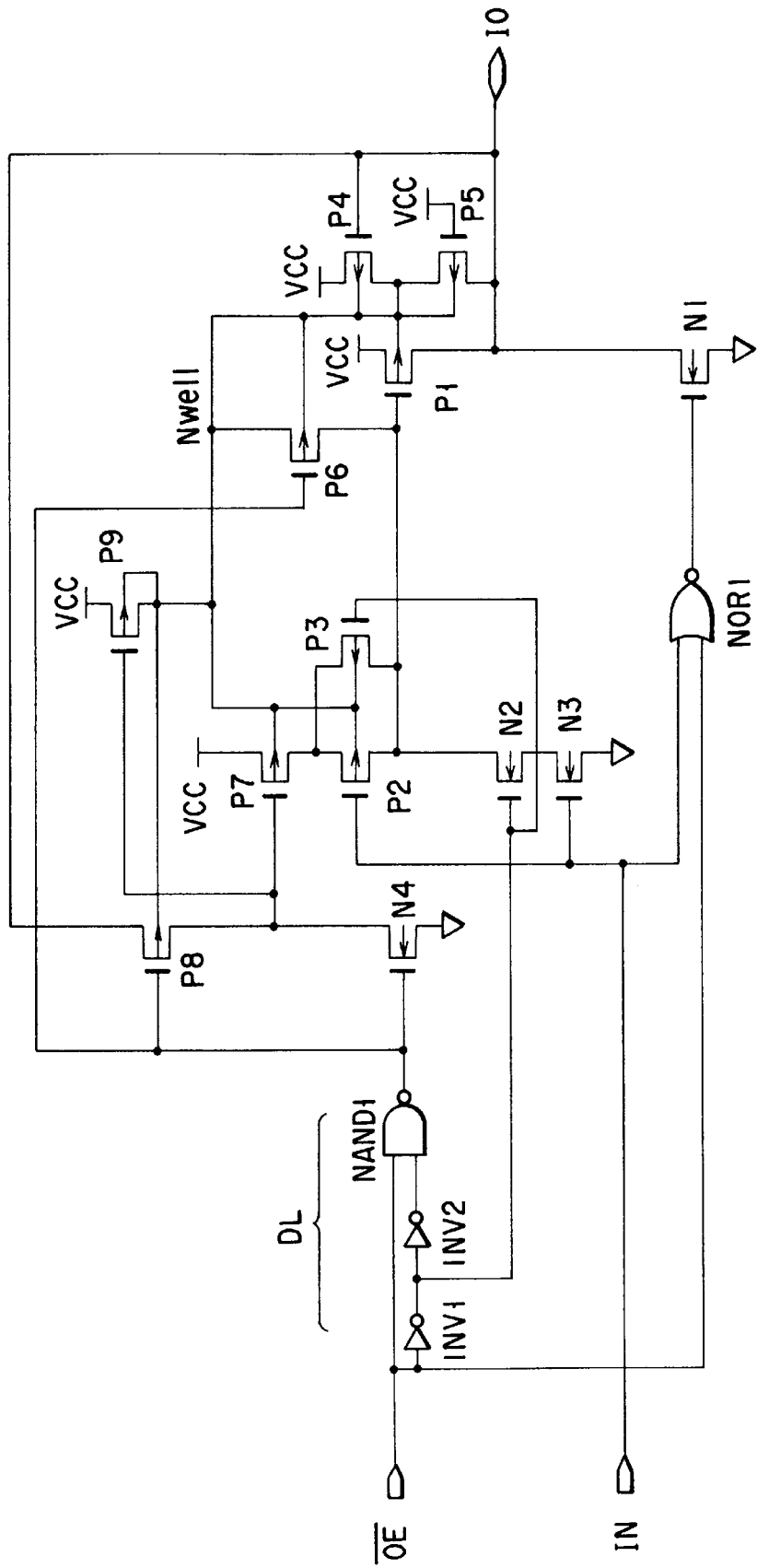
FIG. 4 is a circuit diagram of an example of the output circuit related to the previous invention.

That is, the NAND circuit differs from the circuit of FIG. 4 in that the connection position of the PMOS transistors P2, P3 whose sources and drains are connected in parallel is replaced with the connection position of the PMOS transistor P7 and in that the NMOS transistor N12 is added.

A NOR gate NOR1 is supplied with the output enable signal /OE and input signal IN and generates a gate driving signal for the NMOS transistor N1.

The output of the inverter INV1 to which the output enable signal /OE is supplied is supplied to a NAND gate NAND1 via an inverter INV2. The NAND gate NAND1 is supplied with the signal /OE. The inverters INV1, INV2 and NAND gate NAND1 constitute a delay circuit DL that delays the signal /OE for a specific period of time.

To the back gate of the PMOS transistor P1, the drain and back gate of a PMOS transistor P4 are connected. The PMOS transistor P4 has its source connected to the power-supply voltage Vcc and its gate to the terminal IO. The PMOS transistor P4 is on when the terminal IO is at the low level, causing the power-supply voltage Vcc to be supplied to the back gate of the PMOS transistor P1.

To the back gate of the PMOS transistor P1, the drain and back gate of a PMOS transistor P5 are connected. The PMOS transistor P5 has its source connected to the terminal IO and its gate to the power-supply voltage Vcc. The PMOS transistor P5 is on when the voltage at the terminal IO is more than a specified value higher than the power-supply voltage Vcc, causing the signal voltage at the terminal 10 to be supplied to the back gate of the PMOS transistor P1.

Between the back gate and gate of the PMOS transistor P1, the current path between the source and drain of a PMOS transistor P6 is connected. The PMOS transistor P6 undergoes on/off control on the basis of the control signal VB generated at the control circuit 10. When being brought into the on state, the PMOS transistor P6 functions so as to cause the signal voltage at the back gate of the PMOS transistor P1 to be outputted to the gate side.

The source of a PMOS transistor P8 is connected to the terminal IO. The drain of the PMOS transistor P8 is connected to the drain of the NMOS transistor N4 via the current path between the source and drain of an additional NMOS transistor N13. The gate of the NMOS transistor N13 is connected to the power-supply voltage Vcc. The source of the NMOS transistor N4 is connected to the ground voltage. To the gate of the PMOS transistor P7, the signal at the common drain of the PMOS transistor P8 and NMOS transistor N13 is supplied.

The current path between the source and drain of a PMOS transistor P9 is connected between the power-supply voltage Vcc and the back gate of the PMOS transistor P1. To the gate of the PMOS transistor P9, too, the signal at the common drain of the PMOS transistor P8 and NMOS transistor N13 is supplied.

While in the circuit of FIG. 4, the output of the NAND gate NAND1 in the delay circuit DL is supplied to the gates of the PMOS transistors P6, P8, the control signal VB generated in the control circuit 10 in the present embodiment is supplied to each of the gates of the PMOS transistors P6, P8.

The control circuit 10 is composed of a signal inversion circuit 11 and a bias circuit 12. The signal inversion circuit 11 includes the NMOS transistor 11 and inverts the voltage signal at the signal output terminal IO. Specifically, the signal inversion circuit 11 includes PMOS transistors P11 and P12 and an NMOS transistor N14 in addition to the NMOS transistor N11. The source of the PMOS transistor P11 is connected to the power-supply voltage Vcc. The drain of the PMOS transistor P11 is connected to the source of the PMOS transistor P12. The drain of the PMOS transistor P12 is connected to the drain of the NMOS transistor N14, whose source is connected to the ground voltage. The gate of the PMOS transistor P11 is connected to the signal output terminal IO. Both of the gates of the PMOS transistor P12 and NMOS transistor N14 are connected to the common connection node of the NMOS transistors N11 and N1 provided in the output stage. The inverted signal /IO of the signal at the terminal IO is outputted at the common drain of the PMOS transistor P12 and NMOS transistor N14.

The bias circuit 12 generates a gate driving signal for the PMOS transistors P6 and P8 according to the output /IO of the signal inversion circuit 11, the signal voltage at the signal terminal IO, and the output of the NAND gate NAND1 in the delay circuit DL. The bias circuit 12 is composed of PMOS transistors P13 and P14 and NMOS transistors N15, N16, and N17. The source of the PMOS transistor P13 is connected to the power-supply voltage Vcc. The drain of the PMOS transistor P13 is connected to the node of the control signal VB. The source of the PMOS transistor P14 is connected to the node of the control signal VB. The drain of the NMOS transistor N15 is connected to the drain of the PMOS transistor P14. The source of the NMOS transistor N15 is connected to the ground voltage.

The drain of the NMOS transistor N16 is connected to the power-supply voltage Vcc. The source of the NMOS transistor N16 is connected to the node of the control signal VB. The drain of the NMOS transistor N17 is connected to the node of the control signal VB. The source of the NMOS transistor N17 is connected to the node of the common drain of the PMOS transistor P14 and NMOS transistor N15. The gates of the PMOS transistor P13 and NMOS transistor N15 are connected to form a common gate, to which the output of the NAND gate NAND1 is supplied via an inverter INV3. The gate of the PMOS transistor P14 is connected to the ground voltage. The gate of the NMOS transistor N17 is supplied with the output /IO of the signal inversion circuit 11. The gate of the NMOS transistor N16 is supplied with the voltage at the signal output terminal IO.

Next, the operation of the circuit thus constructed will be described.

First, when the output enable signal /OE is at the ground voltage (low level), that is, when the output circuit is in the state where it can output a signal according to the input signal IN at the signal output terminal IO, the output of the NAND gate NAND1 in the delay circuit DL is at the high level and the output/OE' of the inverter INV3 is at the low level. The output/OE' of the inverter INV3 causes the PMOS transistor P13 in the bias circuit 12 to turn on and the NMOS transistor N15 to turn off. In this mode, the bias circuit 10 generates a control signal VB with a voltage of Vcc, regardless of the levels of other input signals.

On the other hand, the voltage of the signal at the signal output terminal IO is set to either the ground voltage or the power-supply voltage Vcc according to the input signal IN. Therefore, the PMOS transistors P6 and P8 whose gates are supplied with the control signal VB with a voltage of Vcc are both in the off state. This electrically isolates the node of the n-well from the node of the gate of the PMOS transistor P1.

At this time, since the NMOS transistor N4 whose gate is supplied with the output of the NAND gate NAND1 is on and the NMOS transistor N13 whose gate is connected to the power-supply voltage Vcc is on, and the PMOS transistor P8 whose gate is supplied with the control signal VB from the bias circuit 10 is off, the node of the common drain of the PMOS transistor P8 and NMOS transistor N13 is connected to the ground voltage. This brings the PMOS transistors P7 and P9 in the on state. Thus, the NAND circuit composed of the PMOS transistors P2, P3 and the NMOS transistors N2, N3 outputs the inverted signal of the input signal. The inverted signal is supplied to the gate of the PMOS transistor P1 in the output stage. On the other hand, the NOR gate NOR1 outputs the inverted signal of the input signal, too. The inverted signal is supplied to the gate of the NMOS transistor N1 in the output stage. Thus, when the output enable signal /OE is at the low level, the output circuit functions as a bistate output circuit.

Explained next will be the operation of the circuit when the output enable signal /OE is at the power-supply voltage Vcc (high level), that is, when the signal output terminal IO is set in a high impedance state. In this state, the output of the NAND gate NAND1 in the delay circuit DL is at the low level, the output/OE' of the inverter INV3 is at the high level, the PMOS transistor P13 in the bias circuit 12 is off, and the NMOS transistor N15 is on. The bias circuit 12 at this time, together with the parasitic element, is represented by an equivalent circuit in FIG. 7.

Now, explanation will be given as to the operation of the circuit in a case where various signal voltages are applied to the signal output terminal IO from other output circuits, with the signal /OE at the high level and the terminal IO being in the high impedance state.

First, when the low level (the ground voltage) signal is applied to the terminal IO, the output /IO of the signal inversion circuit 11 goes to the high level, causing the NMOS transistor N16 in the bias circuit 12 to turn off and the NMOS transistor N17 to turn on. Therefore, the node of the control signal VB is discharged to the ground voltage via the two NMOS transistors N17 and N15 in the on state, setting the control signal VB to the ground voltage. At this time, the PMOS transistors P6 and P8 whose gates are supplied with the control signal VB are both turned on, which causes the potential of the n-well almost equal to Vcc to be supplied to the gate of the PMOS transistor P1 via the PMOS transistor P6, enabling the PMOS transistor P1 to remain in the off state. That is, the signal output terminal IO remains in the high impedance state.

When the high level (Vcc) signal is applied to the terminal IO, the output of the signal inversion circuit 11 goes to the low level, causing the NMOS transistor N16 in the bias circuit 12 to turn on and the NMOS transistor N17 to turn off. At this time, since the NMOS transistors N15, N16 in the bias circuit 12 are on, the voltage of the control signal VB is set according to the ratio of the driving force of the NMOS transistor N16 alone to the driving force of the NMOS transistor N15 and PMOS transistor P14 connected in series. Then, the voltage of the control signal VB has been set predeterminedly so that the potential difference between the gate and source of each of the PMOS transistors P6 and P8 may be larger than the absolute value $|V_{THP}|$ of each threshold voltage of these transistors. This has been realized by setting the ratio of the driving force of the NMOS transistor N16 to that of the PMOS transistor P14 and NMOS transistor N15. Therefore, the PMOS transistors P6, P8 whose gates are supplied with the control signal VB having the aforementioned voltage are both turned on, which enables the PMOS transistor P1 to remain in the off state as when the low-level signal is applied to the terminal IO, allowing the signal output terminal IO to remain in the high impedance state.

When a voltage signal higher than Vcc, for example, 5V is applied to the terminal IO, the output /IO of the signal inversion circuit 11 goes to the low level, causing the NMOS transistor N16 in the bias circuit 12 to turn on and the NMOS transistor N17 to turn off. At this time, the PMOS transistor P5 turns on when the voltage at the terminal IO is equal to or higher than Vcc+|$V_{THP}$|, causing the voltage at the terminal 10 to be outputted to the back gate of the PMOS transistor P1, or to the n-well. As a result, the voltage of the n-well is the same as that of the terminal 10. The diode D1 in FIG. 7 is a parasitic diode developed between the p-type drain diffused layer of the PMOS transistor and the n-well. Because the diode turns on when the voltage of the terminal IO is Vcc+$V_F$ ($V_F$ is the forward-direction voltage of the diode D1) or higher, the n-well is charged via the diode D1, too. At this time, the PMOS transistor P4 is off.

In this case, too, the voltage of the control signal VB has been set so that the potential difference between the gate and source of each of the PMOS transistors P6, P8 may be larger than the absolute value |$V_{THP}$| of the threshold voltage of each of these transistors and may be less than the breakdown voltage between the gate and source of each of the PMOS transistors P6 and P8. This has been realized by setting the ratio of the driving force of the NMOS transistor N16 to the driving force of the PMOS transistor P14 and NMOS transistor N15. Therefore, the PMOS transistors P6, P8 whose gates are supplied with the control signal VB having the aforementioned voltage are both turned on, which enables the PMOS transistor P1 to remain in the off state as when the low-level signal is applied to the terminal IO, allowing the signal output terminal IO to remain in the high impedance state.

Even when a signal potential higher than Vcc (3.3V) is applied to the terminal IO, because the potential difference between the gate and source of each of the PMOS transistors P6, P8 is set so as to be larger than the absolute value |$V_{THP}$| of the threshold voltage of each of these transistors and be less than the breakdown voltage between the gate and source of each of the PMOS transistors P6 and P8, the reliability of both of the PMOS transistors P6, P8 is prevented from deteriorating.

Furthermore, even when a signal potential higher than Vcc (3.3V) is applied to the terminal IO, the drain side of each of the NMOS transistors N1, N2, N4 is provided with the NMOS transistors N11, N12, N13, respectively, whose gates are provided with the power-supply voltage Vcc. These NMOS transistors only permit the drain potentials of the NMOS transistors N1, N2, N4 to rise up to Vcc−$V_{THN}$ ($V_{THN}$ is the threshold voltage of the NMOS transistor) at most, thereby preventing the reliability of the NMOS transistors N1, N2, N4 from deteriorating.

Additionally, the signal potential of the signal output terminal IO is supplied to the gate of the PMOS transistor P7 via the PMOS transistor P8. On the other hand, the signal potential of the signal output terminal IO is supplied to the node of the gate of the PMOS transistor P1 via the PMOS transistor P6. As a result, the potential difference between the gate and drain of the PMOS transistor P7 becomes almost zero, causing the PMOS transistor P7 to turn off. The output enable signal /OE and input signal IN cause either PMOS transistor P2 or PMOS transistor P3 to turn on, which places the common connection node of the three PMOS transistors P2, P3, and P7 at Vcc, preventing a breakdown problem from arising with these PMOS transistors P2, P3, and P7.

As described above, with the semiconductor integrated circuit in the embodiment, in a case where a plurality of outputs are connected and used, even when power-supply voltages of different values are supplied, current is prevented from flowing between the power supplies. In addition, even when a signal higher in potential than the power-supply voltages in the integrated circuit is applied to the signal output terminal, the reliability of the internal elements is prevented from deteriorating. Consequently, a semiconductor integrated circuit can be constructed using lower-breakdown voltage processing, such as the 3.3-V processing.

Next, various modifications of the semiconductor integrated circuit according to the first embodiment will be described. While in the semiconductor integrated circuit associated with the first embodiment of FIG. 6, the gate of the NMOS transistor N16 in the bias circuit 12 is connected to the signal output terminal IO, the circuit of a first modification shown in FIG. 8 of the first embodiment is such that the gate of the NMOS transistor N16 is modified so as to connect to the back gate n-well of the PMOS transistor P1 or the like. The potential of the back gate n-well is set to the same potential as that of the terminal IO via the PMOS transistor P4 or the diode D1 in FIG. 7, when a high voltage, for example, 5V, is applied to the terminal IO, so that the same effect as that in FIG. 6 can be obtained.

In the semiconductor integrated circuit associated with the first embodiment of FIG. 6, the NAND circuit composed of the PMOS transistors P2, P3, P7 and NMOS transistors N2, N3, N12 constitutes a circuit that generates a gate driving signal for the PMOS transistor P1. In the circuit of a second modification shown in FIG. 9 of the first embodiment, however, a NOR gate NOR2 to which an output enable signal /OE and an input signal/IN are supplied and an inverter circuit composed of PMOS transistors P2 and P7 and NMOS transistors N3 and N12 constitute a circuit that generates a gate driving signal for the PMOS transistor P1.

Specifically, in the inverter circuit, the source of the PMOS transistor P2 is connected to the power-supply voltage Vcc. Between the drain of the PMOS transistor P2 and the node of the gate of the PMOS transistor P1, the current path between the source and drain of the PMOS transistor P7 is connected. To the node of the gate of the PMOS transistor P1, the drain of the NMOS transistor N12 is connected. Between the source of the NMOS transistor N12 and the ground voltage, the current path between the source and drain of the NMOS transistor N3 is connected. To the gates of the PMOS transistor P2 and NMOS transistor N3, the output of the NOR gate NOR2 is supplied. The gate of the PMOS transistor P7 is connected to the node of the common drain of the PMOS transistor P8 and NMOS transistor N13 as with in FIG. 6. To the gate of the NMOS transistor N13, the power-supply voltage Vcc is supplied.

Furthermore, in the circuit of the second modification, the gate of the PMOS transistor P14 in the bias circuit 12 is connected to the drain of the NMOS transistor N15 instead of the ground voltage.

In the circuit of the second modification, the bias circuit 12 functions in the same manner as the equivalent circuit of FIG. 7 when the NMOS transistor N15 is on.

Figure 10:
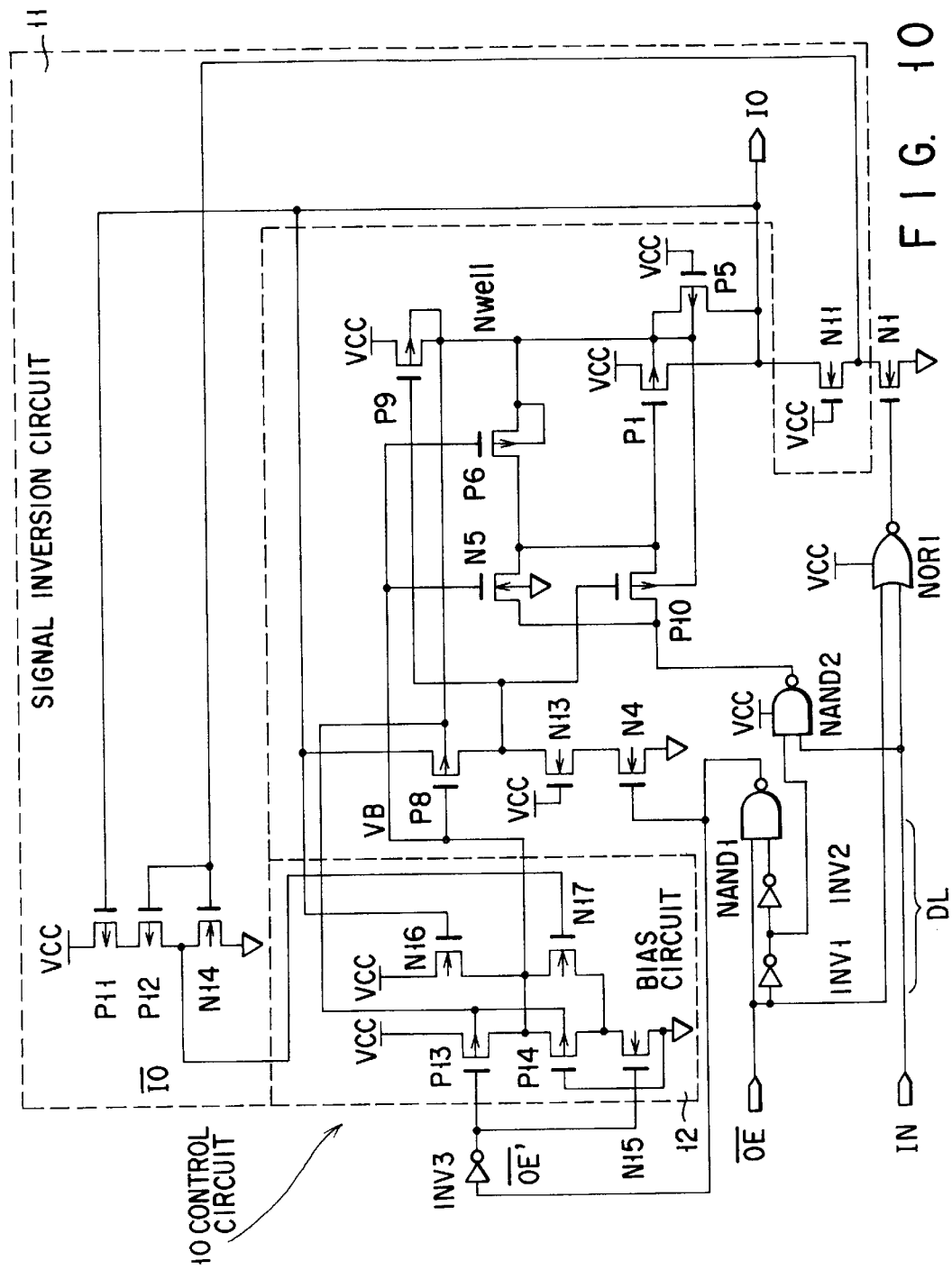
FIG. 10 is a circuit diagram of the output circuit in a semiconductor integrated circuit according to a second embodiment of the present invention.

FIG. 10 shows the configuration of the output circuit in a semiconductor integrated circuit according to a second embodiment of the present invention. The output circuit has a similar configuration to that of the circuit associated with the previous application of FIG. 5 except for part of the circuit of FIG. 5, so explanation will be given with the same parts as those of FIG. 5 being indicated by the same reference symbols. The circuit of FIG. 10 differs greatly from the circuit of FIG. 5 in that a control circuit 10 composed of a signal inversion circuit 11 and a bias circuit 12 is newly provided as explained in FIG. 6.

Furthermore, as with the semiconductor integrated circuit according to the first embodiment shown in FIG. 6, the current path between the source and drain of an NMOS transistor N13 whose gate is connected to the power-supply voltage Vcc is connected between the NMOS transistor P8 and the NMOS transistor N4.

Next, the operation of the circuit thus constructed will be described.

First, when the output enable signal /OE is at the ground voltage (low level), that is, when the output circuit is in the mode in which it can output a signal according to the input signal IN at the signal output terminal IO, the bias circuit 10 generates a control signal VB with a potential of Vcc.

On the other hand, the potential of the signal at the signal output terminal IO is set to either the ground voltage or the power-supply voltage Vcc according to the input signal IN. Therefore, the PMOS transistors P6 and P8 whose gates are supplied with the control signal VB with a voltage of Vcc are both in the off state and the NMOS transistor N5 is on. This electrically isolates the node of the n-well from the node of the gate of the PMOS transistor P1.

At this time, since the NMOS transistor N4 whose gate is supplied with the output of the NAND gate NAND1 is on and the NMOS transistor N13 whose gate is connected to the power-supply voltage Vcc is on, and the PMOS transistor P8 whose gate is supplied with the control signal VB from the bias circuit 10 is off, the node of the common drain of the PMOS transistor P8 and NMOS transistor N13 is connected to the ground voltage. This brings the PMOS transistor P10 in the on state. Thus, the CMOS transfer gate composed of the PMOS transistor P10 and the NMOS transistor N5 is in the on state, causing the inverted signal of the input signal IN, the output of the NAND gate NAND2, is supplied to the gate of the PMOS transistor P1 in the output stage.

On the other hand, the NOR gate NOR1 outputs the inverted signal of the input signal IN, too. The inverted signal is supplied to the gate of the NMOS transistor N1 in the output stage. Thus, when the output enable signal /OE is at the low level, the output circuit functions as a bistate output circuit.

Next, the operation of the circuit with the output enable signal /OE being at the power-supply voltage Vcc (the high level) will be explained. When the signal /OE is at the high level, the output of the NAND gate NAND1 is at the low level, the output/OE' of the inverter INV3 is at the high level, the PMOS transistor P13 in the bias circuit 12 is off, and the NMOS transistor N15 is on. The equivalent circuit of the bias circuit 12 including a parasitic element at this time is the same as that of FIG. 7.

Now, explanation will be given as to the operation of the circuit in a case where various signal potentials are applied to the signal output terminal IO from other output circuits, with the signal /OE at the high level and the terminal IO in the high impedance state.

First, when the low level (the ground voltage) signal is applied to the terminal IO, the output of the signal inversion circuit 11 goes to the high level, which causes the NMOS transistor N16 in the bias circuit 12 to turn off and the NMOS transistor N17 to turn on, setting the control signal VB to the ground voltage. At this time, as explained in FIG. 6, the PMOS transistors P6 and P8 whose gates are supplied with the control signal VB are both turned on, which causes the potential of the n-well almost equal to Vcc to be supplied to the gate of the PMOS transistor P1 via the PMOS transistor P6, enabling the PMOS transistor P1 to remain in the off state. That is, the signal output terminal IO remains in the high impedance state.

When the high level (Vcc) signal is applied to the terminal IO, the output of the signal inversion circuit 11 goes to the low level, causing the NMOS transistor N16 in the bias circuit 12 to turn on and the NMOS transistor N17 to turn off. At this time, as explained in FIG. 6, the potential of the control signal VB is set according to the ratio of the driving force of the NMOS transistor N16 alone to the driving force of the PMOS transistor P14 and NMOS transistor N15 connected in series. Then, the potential of the control signal VB has been set predeterminedly so that the potential difference between the gate and source of each of the PMOS transistors P6 and P8 may be larger than the absolute value IVTHP1 of each threshold voltage of these transistors. This has been realized by setting the ratio of the driving force of the PMOS transistors P14 and NMOS transistor N15 to that of the NMOS transistor N16.

Therefore, the PMOS transistors P6, P8 whose gates are supplied with the control signal VB having the aforementioned voltage are both turned on, which enables the PMOS transistor P1 to remain in the off state as when the low-level signal is applied to the terminal IO, allowing the signal output terminal IO to remain in the high impedance state.

When a voltage signal higher than Vcc, for example, 5V, is applied to the terminal IO, the output of the signal inversion circuit 11 goes to the low level, causing the NMOS transistor N16 in the bias circuit 12 to turn on and the NMOS transistor N17 to turn off. At this time, the PMOS transistor P5 turns on when the potential at the terminal IO is equal to or higher than Vcc+$|V_{THP}|$, causing the potential at the terminal IO to be outputted to the back gate of the PMOS transistor P1, or to the n-well. As a result, the potential of the n-well is the same as that of the terminal IO. The potential of the terminal IO is also transferred to the n-well through the parasitic diode between the p-type drain diffused layer of the PMOS transistor P1 and the n-well.

In this case, too, the potential of the control signal VB has been set so that the potential difference between the gate and source of each of the PMOS transistors P6, P8 may be larger than the absolute value $|V_{THP}|$ of the threshold voltage of each of these transistors and may be lower than the breakdown voltage between the gate and source of each of the PMOS transistors P6 and P8. This has been realized by setting the ratio of the driving force of the PMOS transistor P14 and NMOS transistor N15 to the driving force of the NMOS transistor N16. Therefore, the PMOS transistors P6, P8 whose gates are supplied with the control signal VB having the aforementioned potential are both turned on, which enables the PMOS transistor P1 to remain in the off state as when the low-level signal is applied to the terminal 10, allowing the signal output terminal IO to remain in the high impedance state.

Figure 5:
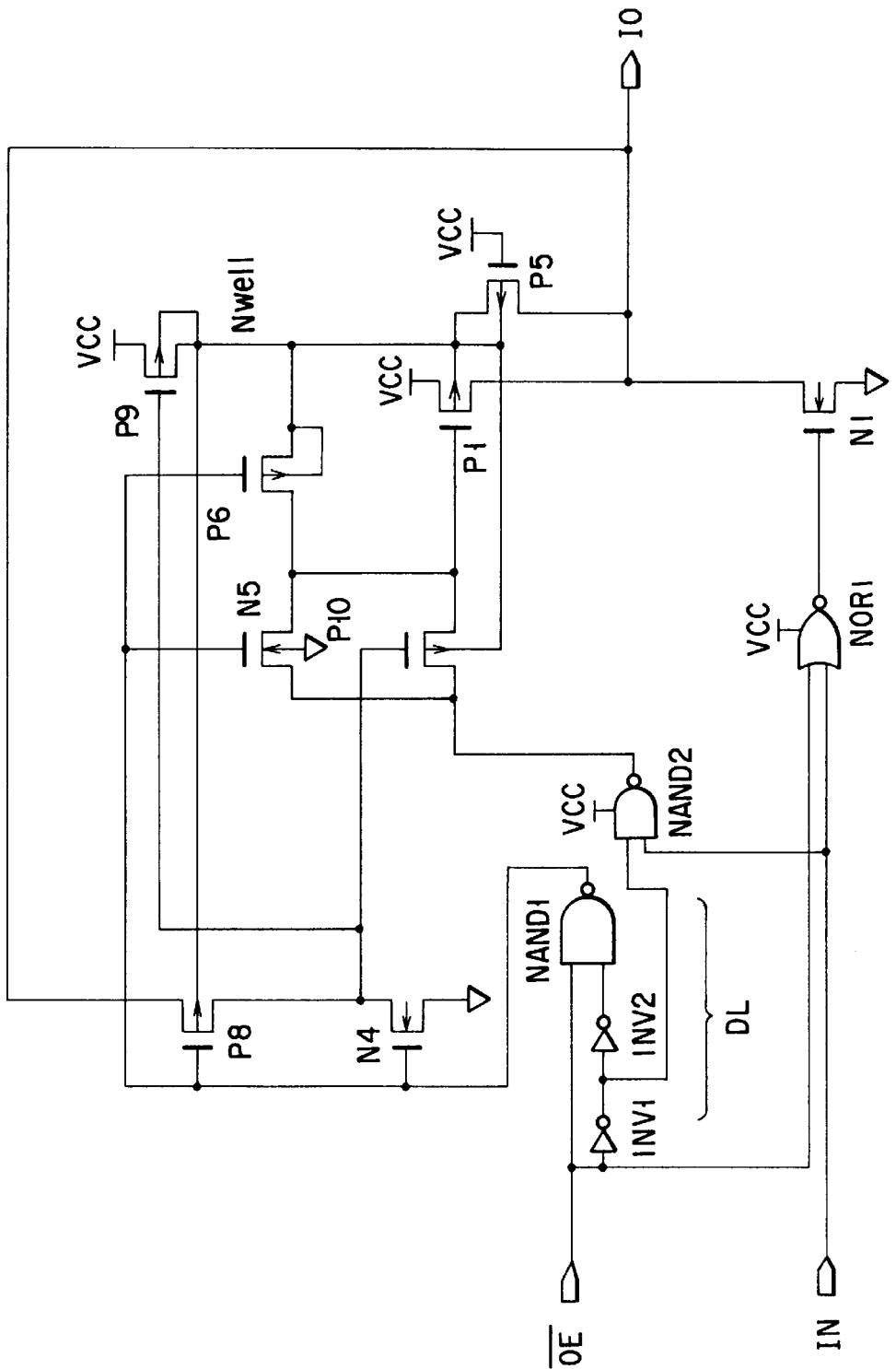
FIG. 5 is a circuit diagram of an example of the output circuit related to the previous invention.

In the circuit of the second embodiment, the gate of the NMOS transistor N5 is supplied with the control signal VB from the control circuit 10, not the high level/low level signal from the NAND gate NAND1 as in the circuit of FIG. 5. In the second embodiment, by modifying the connection of the gate of the NMOS transistor N5 as described above, the following excellent characteristics can be achieved.

In the circuit of FIG. 10, when the output enable signal /OE is at the high level and a voltage higher than Vcc is applied to the terminal IO, the potential at the node of the gate of the PMOS transistor P1 is the same as that of the terminal IO. In the circuit of FIG. 5 where the high level/low level output from the NAND gate NAND1 is supplied to the gate of the NMOS transistor N5, when a leakage current flows in the NMOS transistor N5 with the potential difference between its gate and source being zero, unnecessary current can flow from the terminal IO to the node of the power-supply voltage Vcc via the NAND gate NAND2. With the circuit of FIG. 10, however, since the control signal VB is supplied to the gate of the NMOS transistor N5, the potential difference between the gate and source of the NMOS transistor N5 is negative, with the output of the NAND gate NAND2 being at the high level (Vcc) and the control signal VB being at a potential between the ground voltage and the power-supply voltage Vcc. This brings the NMOS transistor N5 into a sufficient off state, making the leakage current smaller than the circuit of FIG. 5.

As described above, with the semiconductor integrated circuit in the second embodiment, too, in a case where a plurality of outputs are connected and used, even when power-supply voltages of different values are supplied, current is prevented from flowing between the power supplies. In addition, even when a signal higher in potential than the power-supply voltages in the integrated circuit is applied to the signal output terminal, the reliability of the internal elements is prevented from deteriorating. Consequently, a semiconductor integrated circuit can be constructed using lower-breakdown voltage processing, such as the 3.3-V processing.

The present invention is not limited to the above-described embodiments. The invention may be practiced or embodied in still other ways without departing from the spirit or essential character thereof. For instance, in addition to the configurations described above, the control circuit 10 may have each of the configurations shown in FIGS. 11 to 14.

As compared with the control circuits of FIGS. 6 and 8, in the control circuit 10 of FIG. 11, the connection position of the NMOS transistor N15 is replaced with the connection position of the PMOS transistor P14 and NMOS transistor N17.

In the control circuit 10 of FIG. 12, the back gate of the PMOS transistor P14 is connected to the source of the PMOS transistor P14 instead of being connected to the n-well or Vcc.

In the control circuit 10 of FIG. 13, a resistor R1 is connected in place of the PMOS transistor P14 of FIG. 12. A current source may be connected in place of the resistor R1. Use of the current source enables the value of current that flows to remain unchanged even when the potential of the signal VB rises, so that the drawn current is prevented from increasing.

In the control circuit 10 of FIG. 14, in place of the resistor R1 of FIG. 13, the current path between the source and drain of the NMOS transistor N18 whose gate is connected to the power-supply voltage Vcc is connected.

As described above, use of the control circuit 10 having each of the configurations shown in FIGS. 11 to 14 produces the same effect.

As described until now, with the present invention, even when power-supply voltages differing in value are supplied in a case where a plurality of outputs are connected and used, current is prevented from flowing between the power supplies. In addition, it is possible to provide a semiconductor integrated circuit that prevents the reliability of the internal elements from deteriorating even when a voltage higher than the power-supply voltages inside the integrated circuit is applied to the signal output terminal.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:

a power-supply voltage terminal;

an output terminal to which an external voltage higher than the power supply voltage can be applied; and a first MOS transistor which has a source, a drain, a gate, and a back gate, one end of a current path between the source and the drain being connected to said output terminal;

a control circuit which is supplied with said power-supply voltage and supplies a control voltage to said gate of said first MOS transistor;

wherein when an external voltage higher than said power-supply voltage is applied to said output terminal, said control circuit supplies to said gate of said first MOS transistor said control voltage having a value varying in an analogue relationship with said external voltage within a range of values lower than said power-supply voltage and turns on said first MOS transistor, so that a potential difference between said one end of said current path and said gate of said first MOS transistor is higher than an absolute value of a threshold voltage of said first MOS transistor, thereby permitting said external voltage at said one end of said current path between the source and the drain of said first MOS transistor to be transmitted to the other end of said current path, wherein said control circuit further includes:

a control voltage output terminal outputting said control voltage;

a first reference potential terminal having a lower potential than said power-supply voltage;

a second MOS transistor of a conductivity type opposite to that of said first MOS transistor, having a source, a drain, a gate, a back gate, with a current path between the source and the drain being connected between said power-supply voltage terminal and said control voltage output terminal, and the gate being connected to the output terminal, to which an external voltage higher than the power supply voltage can be applied; and a pull-down element having a current path connected between said output terminal and said first reference potential terminal.

2. The semiconductor integrated circuit according to claim 1, wherein said control circuit has a function of turning off said first MOS transistor when an external voltage higher than said power-supply voltage is not applied to said output terminal.

3. The semiconductor integrated circuit according to claim 1, wherein said control circuit includes:

a control voltage output terminal outputting said control voltage;

a first reference potential terminal having a lower potential than said power-supply voltage; and a circuit capable of cutting off the current path between said control voltage output terminal and said first reference potential terminal and pulling up said control voltage output terminal to said power-supply voltage, when said output terminal is not supplied with an external voltage higher than said power-supply voltage.

4. The semiconductor integrated circuit of claim 1, wherein the external voltage applied to the output terminal can be as large as a sum of a breakdown voltage of the first MOS transistor and the power supply voltage without damaging the first MOS transistor.

5. A semiconductor integrated circuit comprising:

a power-supply voltage terminal;

an output terminal to which an external voltage higher than the power-supply voltage can be applied; and a first MOS transistor which has a source, a drain, a gate and a back gate, one end of a current path between the source and the drain being connected to said output terminal;

a control circuit which is supplied with said power-supply voltage and supplies a control voltage to said gate of said first MOS transistor;

wherein when an external voltage higher than said power-supply voltage is applied to said output terminal, said control circuit supplies to said gate of said first MOS transistor said control voltage having a value varying in an analogue relationship with said external voltage within a range of values lower than said power-supply and turns on said first MOS transistor, so that a potential difference between said one end of said current path and said gate of said first MOS transistor is higher than an absolute value of a threshold voltage of said first MOS transistor, thereby permitting said external voltage at said one end of said current path between the source and the drain of said first MOS transistor to be transmitted to the other end of said current path, wherein said control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a second MOS transistor of the same conductivity type as said first MOS transistor, having a source, a drain, a gate, and a back gate, with a current path between the source and drain being connected between said power-supply voltage and said control voltage output terminal, and the gate being supplied with a first control input signal;

a third MOS transistor of the same conductivity type as said first MOS transistor, having a source, a drain, a gate, and a back gate, with a current path between the source and drain being coupled between said control voltage output terminal of said control circuit and said first reference potential terminal, and the gate being supplied with the first reference potential terminal;

a fourth MOS transistor of a conductivity type opposite to that of said first MOS transistor, having a source, a drain, a gate, and a back gate, with a current path between the source and drain being connected in series with said current path of said third MOS transistor, and the gate being supplied with said first control input signal;

a fifth MOS transistor of a conductivity type opposite to that of the first MOS transistor, having a source, a drain, a gate, and a back gate, with a current path between the source and drain being connected between said power-supply voltage and said control voltage output terminal of said control circuit, and the gate being connected with said output terminal to which an external voltage higher than said power-supply voltage can be applied; and a sixth MOS transistor of a conductivity type opposite to that of said first MOS transistor, having a source, a drain, a gate, and a back gate, with a current path between the source and drain being connected in parallel with the current path of said third MOS transistor, and the gate being supplied with said output signal of said signal inversion circuit.

6. The control circuit according to claim 5, wherein a ratio of driving force of said third and fourth MOS transistors being connected in series, to that of said fifth MOS transistor is adjusted so that a potential difference between said gate of said first MOS transistor and said current path of said first MOS transistor may be within a desired range of values.

7. A semiconductor integrated circuit comprising:

a power-supply voltage terminal;

an output terminal to which external voltage higher than the power-supply voltage can be applied; and a first MOS transistor which has a source, a drain, a gate, and a back gate, one end of a current path between the source and the drain being connected to said output terminal;

a control circuit which is supplied with said power-supply voltage and supplies a control voltage to said gate of said first MOS transistor;

wherein when an external voltage higher than said power-supply voltage is applied to said output terminal, said control circuit supplies to said gate of said first MOS transistor said control voltage having a value varying in an analogue relationship with said external voltage within a range of values lower than said power-supply voltage and turns on said first MOS transistor, so that a potential difference between said one end of said current path and said gate of said first MOS transistor is higher than an absolute value of a threshold voltage of said first MOS transistor, thereby permitting said external voltage at said one end of said current path between the source and the drain of said first MOS transistor to be transmitted to the other end of said current path, wherein said control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a second MOS transistor of the same conductivity type as said first MOS transistor, having a source, a drain, a sate, and a back gate, with a current path between the source and drain being connected between said power-supply voltage and said control voltage output terminal of said control circuit, and the gate being supplied with a first control input signal;

a resistor element having a current path connected between said control voltage output terminal of said control circuit and said first reference potential terminal;

a third MOS transistor of a conductivity type opposite to that of said first MOS transistor, having a source, a drain, a gate, and a back gate, with a current path between the source and drain being connected in series with said current path of said resistor element, and the gate being supplied with the first control input signal;

a fourth MOS transistor of a conductivity type opposite to that of said first MOS transistor, having a source, a drain, a gate, and a back gate, with a current path between the source and drain being connected between said power-supply voltage and said control voltage output terminal of said control circuit, and the gate being connected with said output terminal to which an external voltage higher than said power-supply voltage can be supplied; and a fifth MOS transistor of a conductivity type opposite to that of said first MOS transistor, having a source, a drain, a gate, and a back gate, with a current path between the source and drain being connected in parallel with said current path of said resistor element, and the gate being supplied with the output terminal of said signal inversion circuit.

8. The control circuit according to claim 7, wherein a ratio of driving force of said resistor element and said third MOS transistor being connected in series, to that of said fourth MOS transistor is adjusted so that a potential difference between said gate of said first MOS transistor and said current path of said first MOS transistor may be within a desired range of values.

9. A semiconductor integrated circuit comprising:

a power-supply voltage terminal;

an output terminal to which an external voltage higher than the power-supply voltage can be applied; and a first MOS transistor which has a source drain, a gate, and a back gate, one end of a current path between the source and the drain being connected to said output terminal;

a control circuit which is supplied with said power-supply voltage and supplies a control voltage to said gate of said first MOS transistor;

wherein when an external voltage higher than said power-supply voltage is applied to said output terminal, said control circuit supplies to said gate of said first MOS transistor said control voltage having a value varying in an analogue relationship with said external voltage within a range of values lower than said power-supply voltage and turns on said first MOS transistor, so that a potential difference between said one end of said current path and said gate of said first MOS transistor is higher than an absolute value of a threshold voltage of said first MOS transistor, thereby permitting said external voltage at said one end of said current path between the source and the drain of said first MOS transistor to be transmitted to the other end of said current path, wherein said control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a second MOS transistor of the same conductivity type as said first MOS transistor, having a source, a drain, a gate, and a back gate, with a current path between the source and drain being connected between said power-supply voltage and said control voltage output terminal of said control circuit, and the gate being supplied with a first control input signal;

a third MOS transistor of a conductivity type opposite to that of said first MOS transistor, having a source, a drain, a gate, and a back gate, with a current path between the source and drain being coupled between said control voltage output terminal of said control circuit and said first reference potential terminal, and the gate being supplied with said power-supply voltage;

a fourth MOS transistor of a conductivity type opposite to that of said first MOS transistor, having a source, a drain, a gate, and a back gate, with a current path between the source and drain being connected in series with said current path of said third MOS transistor, and the gate being supplied with said first control input signal;

a fifth MOS transistor of a conductivity type opposite to that of said first MOS transistor, having a source, a drain, a gate, and a back gate, with a current path between the source and drain being connected between said power-supply voltage and said control voltage output terminal of said control circuit, and the gate being connected with said output terminal to which an external voltage higher than said power-supply voltage can be applied; and a sixth MOS transistor of a conductivity type opposite to that of said first MOS transistor, having a source, a drain, a gate, and a back gate, with a current path between the source and drain being connected in parallel with said current path of said third MOS transistor, and the gate being supplied with said output signal of said signal inversion circuit.

10. The control integrated circuit according to claim 9, wherein a ratio of driving force of said third and fourth MOS transistors being connected in series, to that of said fifth MOS transistor is adjusted so that a potential difference between said gate of said first MOS transistor and said current path of said first MOS transistor may be within a desired range of values.

11. A drive circuit which is supplied with a power-supply voltage and is capable of driving an output terminal in a drive mode and applying an external voltage exceeding said power-supply voltage to said output terminal in a high impedance mode, comprising:

a first MOS transistor having a source drain, a gate, and a back gate, with a current path between the source and the drain being connected between a power-supply voltage terminal and said output terminal;

a second MOS transistor of the same conductivity type as said first MOS transistor, having a source, a drain, a gate, and a back gate, with a current path between the source and the drain being connected between said back gate of said first MOS transistor and said gate of said first MOS transistor, and said back gate being connected with said back gate of said first MOS transistor;

a third MOS transistor of the same conductivity type as said first MOS transistor, having a source, a drain, a gate, and a back gate, with a current path between the source and the drain being coupled between said power-supply voltage terminal and said gate of said first MOS transistor, and said back gate being connected with said back gate of said first MOS transistor;

a fourth MOS transistor of the same conductivity type as that of said first MOS transistor, having a source, a drain, a gate, and a back gate, with a current path between the source and the drain being connected between said output terminal and said gate of said third MOS transistor, and the back gate being connected with said back gate of said first MOS transistor; and a control circuit supplying a control voltage to said gate of said second MOS transistor and said gate of said fourth MOS transistor;

wherein when an external voltage higher than said power-supply voltage is applied to said output terminal, said control circuit supplies to said gates of said second and fourth MOS transistors said control voltage having a value varying in an analogue relationship with said external voltage within a range of values lower than said power-supply voltage and turns on said second and fourth MOS transistors, so that a potential difference between said output terminal and said gate of said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third MOS transistor, and a voltage at said back gate terminal of said first MOS transistor to be transmitted to said gate of said first MOS transistor, wherein said control circuit includes:

a control voltage output terminal outputting said control voltage;

a first reference potential terminal having a lower potential than said power-supply voltage;

a fifth MOS transistor of a conductivity type opposite to that of said first MOS transistor, having a source, a drain, a gate, a back gate, with a current path between the source and the drain being connected between said power-supply voltage and said control voltage output terminal, and the gate being connected to said output terminal to which an external voltage higher than the power-supply voltage can be applied; and a pull-down element having a current path connected between said control voltage output terminal and said first reference potential terminal.

12. The driver circuit according to claim 11, further including a circuit which turns on said third MOS transistor in said drive mode.

13. The driver circuit according to claim 11, further including a fifth MOS transistor of a same conductivity type of said first MOS transistor, having a source, a drain, a gate, and a back gate, with a current path between the source and the drain being connected between the power-supply source terminal and said back gate of said first MOS transistor, the gate being supplied with a signal which is supplied to the gate of said third MOS transistor, and the back gate being connected with said back gate of said first MOS transistor.

14. The driver circuit according to claim 13, further including a circuit which turns on said fifth MOS transistor in said drive mode.

15. The driver circuit according to claim 11, wherein said control circuit can turn off said second and fourth MOS transistors in said drive mode.

16. The driver circuit according to claim 11, wherein said control circuit includes:

a control voltage output terminal outputting said control voltage;

a first reference potential terminal having a lower potential than said power-supply voltage;

a circuit capable of cutting off said current path between the control voltage output terminal and said first reference voltage terminal and pulling up said control voltage output terminal to said power-supply voltage in said drive mode.

17. The semiconductor integrated circuit of claim 11, wherein the external voltage applied to the output terminal can be as large as a sum of a breakdown voltage of the first MOS transistor and the power supply voltage without damaging the first MOS transistor.

18. A driver circuit which is supplied with a power-supply voltage and is capable of driving an output terminal in a drive mode and applying an external voltage exceeding said power-supply voltage to said output terminal in a high impedance mode, comprising:

a first MOS transistor having a source, a drain, a gate, and a back gate, with a current path between the source and the drain being connected between a power-supply voltage terminal and said output terminal;

a second MOS transistor of the same conductivity type as said first MOS transistor, having a source, a drain, a gate, and a back gate, with a current path between the source and the drain being connected between said back gate of said first MOS transistor and said gate of said first MOS transistor, and said back gate being connected with said back gate of said MOS transistor;

a third MOS transistor of the same conductivity type as said first MOS transistor, having a source, a drain, a gate, and a back gate, with a current path between the source and the drain being coupled between said power-supply voltage terminal and said gate of said first MOS transistor, and said back gate being connected with said back gate of said first MOS transistor;

a fourth MOS transistor of the same conductivity type as that of said first MOS transistor, having a source, a drain, a gate, and a back gate, with a current path between the source and the drain being connected between said output terminal and said gate of said third MOS transistor, and the back gate being connected with said back gate of said first MOS transistor; and a control circuit supplying a control voltage to said gate of said second MOS transistor said gate of said fourth MOS transistor;

wherein when an external voltage higher than said power-supply voltage is applied to said output terminal, said control circuit supplies to said gates of said second and fourth MOS transistors said control voltage having a value varying in analogue relationship with said external voltage within a range of values lower than said power-supply voltage and turns on said second and fourth MOS transistors, so that a potential difference between said output terminal and said gate of said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third transistor, and a voltage at said back gate terminal of said first MOS transistor to be transmitted to said gate of said first MOS transistor, wherein said control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a fifth MOS transistor of the same conductivity type as said first MOS transistor, having a source, a drain, a gate, and a back gate, with a current path between the source and the drain being connected between said power-supply voltage terminal and the control voltage output terminal of said control circuit, and the gate being supplied with a first control input signal;

a sixth MOS transistor of the same conductivity type as said first MOS transistor, having a source, a drain, a gate, and a back gate, with a current path between the source and the drain being connected between said control voltage output terminal of said control circuit and said first reference potential terminal, and the gate being supplied with the first reference potential;

a seventh MOS transistor of a conductivity type opposite to that of the first MOS transistor, having a source, a drain, a gate, and a back gate, with a current path between the source and the drain being connected in series with said current path of said sixth MOS transistor, and the gate being supplied with said first control input signal;

an eighth MOS transistor of a conductivity type opposite to that of the first MOS transistor, having a source, a drain, a gate, and a back gate, with a current path between the source and the drain being connected between said power-supply voltage terminal and said control voltage output terminal of said control circuit, and the gate being connected with said output terminal to which an external voltage higher than said power-supply voltage can be applied; and a ninth MOS transistor of a conductivity type opposite to that of the first MOS transistor, having a source, a drain, a gate, and a back gate, with a current path between the source and the drain being connected in parallel with said current path of said sixth MOS transistor, and the gate being supplied with said output signal of said signal inversion circuit.

19. The control circuit according to claim 18, wherein a ratio of driving force of said sixth and seventh MOS transistors being connected in series, to that of said eighth MOS transistor is adjusted so that a potential difference between said gate of said first MOS transistor and said current path of said first MOS transistor may be within a desired range of values.

20. A driver circuit which is supplied with a power-supply voltage and is capable of driving an output terminal in a drive mode and applying an external voltage exceeding said power-supply voltage to said output terminal in a high impedance mode, comprising:

a first MOS transistor having a source, a drain, a gate, and a back gate, with a current path between the source and the drain being connected between a power-supply voltage terminal and said output terminal;

a second MOS transistor of the same conductivity type as said first MOS transistor, having a source, a drain, a gate and a back gate, with a current path between the source and the drain being connected between said back gate of said first MOS transistor and said gate of said first MOS transistor, and said back gate being connected with said back gate of said first MOS transistor;

a third MOS transistor of the same conductivity type as said first MOS transistor, having a source, a drain, a gate, and a back gate, with a current path between the source and the drain being coupled between said power-supply voltage terminal and said gate of said first MOS transistor, and said back gate being connected with said back gate of said first MOS transistor;

fourth MOS transistor of the same conductivity type as that of said first MOS transistor, having a source, a drain, a gate, and a back gate, with a current path between the source and the drain being connected between said output terminal and said gate of said third MOS transistor, and the back gate being connected with said back gate of said first MOS transistor; and a control circuit supplying a control voltage to said gate of said second MOS transistor and said gate of said fourth MOS transistor;

wherein when an external voltage higher than said power-supply voltage is applied to said output terminal, said control circuit supplies to said gates of said second and fourth MOS transistors said control voltage having a value varying in an analogue relationship with said external voltage within a range of values lower than said power-supply voltage and turns on said second and fourth MOS transistors, so that a potential difference between said output terminal and said gate of said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third MOS transistor, and a voltage at said back gate terminal of said first MOS transistor to be transmitted to said gate of said first MOS transistor, wherein said control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a fifth MOS transistor of the same conductivity type as said first MOS transistor, having a source, a drain, a gate, and a back gate, with a current path between the source and the drain being connected between said power-supply voltage terminal and the control voltage output terminal of said control circuit, and the gate being supplied with the first control input signal;

a resistor element having a current path being connected between said control voltage output terminal of said control circuit and said first reference potential terminal;

a sixth MOS transistor of a conductivity type opposite to that of said first MOS transistor, having a source, a drain, a gate, and a back gate, with a current path between the source and the drain being connected in series with said current path of said resistor element, and the gate being supplied with said first control input signal;

a seventh MOS transistor of a conductivity type opposite to that of the first MOS transistor, having a source, a drain, a gate, and a back gate, with a current path between the source and the drain being connected between said power-supply voltage terminal and said control voltage output terminal of said control circuit, and the gate being connected with said output terminal to which an external voltage higher than said power-supply voltage; and an eight MOS transistor of a conductivity type opposite to that of the first MOS transistor, having a source, a drain, a gate, and a back gate, with a current path between the source and the drain being connected in parallel with said current path of said resistor element, and the gate being supplied with the output terminal of said signal inversion circuit.

21. The control circuit according to claim 20, wherein a ratio of driving force of said resistor element and said sixth MOS transistor being connected in series, to that of said seventh MOS transistor is adjusted so that a potential difference between said gate of said first MOS transistor and said current path of said first MOS transistor may be within a desired range of value.

22. A driver circuit which is supplied with a power-supply voltage and is capable of driving an output terminal in a drive mode and applying an external voltage exceeding said power-supply voltage to said output terminal in a high impedance mode, comprising:

a first MOS transistor having a source, a drain, a gate, and a back gate, with a current path between the source and the drain being connected between a power-supply voltage terminal and said output terminal;

a second MOS transistor of the same conductivity type as said first MOS transistor, having a source, a drain, a gate, and a back gate, with a current path between the source and the drain being connected between said back gate of said first MOS transistor and said gate of said first MOS transistor, and said back gate being connected with said back gate of said first MOS transistor;

a third MOS transistor of the same conductivity type as said first MOS transistor, having a source, a drain, a gate, and a back gate, with a current path between the source and the drain being coupled between said power-supply voltage terminal and said gate of said first MOS transistor, and said back gate being connected with said back gate of said first MOS transistor;

a fourth MOS transistor of the same conductivity type as that of said first MOS transistor, having a source, a drain, a gate, and a back gate, with a current path between the source and the drain being connected between said output terminal and said gate of said third MOS transistor, and the back gate being connected with said back gate of said first MOS transistor; and a control circuit supplying a control voltage to said gate of said second MOS transistor and said gate of said fourth MOS transistor;

wherein when an external voltage higher than said power-supply voltage is applied to said output terminal, said control circuit supplies to said gates of said second and fourth MOS transistors said control voltage having a value varying in an analogue relationship with said external voltage within a range of values lower than said power-supply voltage and turns on said second and fourth MOS transistors, so that a potential difference between said output terminal and said gate of said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third MOS transistor, and a voltage at said back gate terminal of said first MOS transistor to be transmitted to said gate of said first MOS transistor, wherein said control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a fifth MOS transistor of the same conductivity type as said first MOS transistor, having a source, a drain, a gate, and a back gate, with a current path between the source and the drain being connected between said power-supply voltage terminal and said control voltage output terminal of said control circuit, and the gate being supplied with a first control input signal;

a sixth MOS transistor of a conductivity type opposite to that of said first MOS transistor, having a source, a drain, a gate, and a back gate, with a current path between the source and the drain being connected between said control voltage output terminal of said control circuit and said first reference potential terminal, and the gate being supplied with said power-supply voltage;

seventh MOS transistor of a conductivity opposite to that of the first MOS transistor, having a source, a drain, a gate, and a back gate, with a current path between the source and the drain being connected in series, with said current path of said sixth MOS transistor, and the gate being supplied with said first control input signal;

an eighth MOS transistor of a conductivity type opposite to that of the first MOS transistor, having a source, a drain, a gate, and a back gate, with a current path between the source and the drain being connected between said power-supply voltage terminal and said control voltage output terminal of said control circuit, and the gate being connected with said output terminal to which an external voltage higher than said power-supply voltage can be applied; and a ninth MOS transistor of a conductivity type opposite to that of the first MOS transistor, having a source, a drain, a gate, and a back gate, with a current path between the source and the drain being connected in parallel with said current path of said sixth MOS transistor, and the gate being supplied with the output signal of said signal inversion circuit.

23. The control circuit according to claim 22, wherein a ratio of driving force of said sixth and seventh MOS transistors being connected in series, to that of said eighth MOS transistor is adjusted so that a potential difference between said gate of said first MOS transistor and said current path of said first MOS transistor may be within a desired range of value.

24. A driver circuit which is supplied with a power-supply voltage and is capable of driving an output terminal in a drive mode and applying an external voltage exceeding said power-supply voltage to said output terminal in a high impedance mode, comprising:

a first MOS transistor having a source, a drain, a gate, and a back gate, with a current path between the source and the drain being connected between a power-supply voltage terminal and said output terminal;

a second MOS and transistor of the same conductivity type as said first MOS transistor, having a source, a drain, a gate, and a back gate, with a current path between the source and the drain being connected between said back gate of said first MOS transistor and said gate of first MOS transistor, and said back gate of said second MOS transistor being connected with said back gate of said first MOS transistor;

a first control circuit having a first control signal output terminal for providing a control signal with said gate of said first MOS transistor;

a third MOS transistor of the same conductivity type as said first MOS transistor, having a source, a drain, a gate, and a back gate, with a current path between the source and the drain being coupled between said first control signal output terminal of said first control circuit and said gate of said first MOS transistor, and said back gate of said third MOS transistor being connected with said back gate of said first MOS transistor;

a fourth MOS transistor of the same conductivity type as said first MOS transistor, having a source, a drain, a gate, and a back gate, with a current path between the source and the drain being connected between said output terminal and said gate of said third MOS transistor, and said back gate of said fourth MOS transistor being connected with said back gate of said first MOS transistor; and a second control circuit for supplying a control voltage to said gates of said second and fourth MOS transistors;

wherein when an external voltage higher than said power-supply voltage is applied to said output terminal in a high impedance mode, said second control circuit supplies to said gates of said second and fourth MOS transistors said control voltage having a value varying in an analogue relationship with said external voltage within a range of values lower than said power-supply voltage, and turns on said second and fourth MOS transistors, so that a potential difference between said output terminal and said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third MOS transistor, and a voltage at said back gate of said first MOS transistor to be transmitted to said gate of said first MOS transistor;

wherein said second control circuit includes:

a control voltage output terminal outputting said control voltage;

a first reference potential terminal having a lower potential than said power-supply voltage;

a fifth MOS transistor of a conductivity type opposite to that of said first MOS transistor, having a source, a drain, a gate, a back gate, with a current path between the source and the drain being connected between said power-supply voltage terminal and said control voltage output terminal, and the gate being connected to said output terminal to which an external voltage higher than the power-supply voltage can be applied; and a pull-down element having a current path connected between said control voltage output terminal and said first reference potential terminal.

25. The driver circuit according to claim 24, further including a circuit for turning on said third MOS transistor in said drive mode.

26. The driver circuit according to claim 24, further including a sixth MOS transistor of the same conductivity type as said first MOS transistor, having a source, a drain, a gate, and a back gate, with a current path between the source and the drain being connected between said power-supply voltage terminal and said back gate of said first MOS transistor, the gate being supplied with the signal which is supplied to the gate of said third MOS transistor, and the back gate of said fifth MOS transistor being connected with said back gate of said first MOS transistor.

27. The driver circuit according to claim 26, further including a circuit for turning on said sixth MOS transistor in said drive mode.

28. The driver circuit according to claim 24, wherein said second control circuit can turn off said second and fourth MOS transistors in said drive mode.

29. The driver circuit according to claim 24, wherein said second control circuit further includes:

a circuit capable of cutting off said current path between said control voltage output terminal and said first reference potential terminal and pulling up said power-supply voltage to said control voltage output terminal in said drive mode.

30. The circuit of claim 24, wherein the external voltage applied to the output terminal can be as large as a sum of a breakdown voltage of the first MOS transistor and the power supply voltage without damaging the first MOS transistor.

31. A driver circuit which is supplied with a power-supply voltage and is capable of driving an output terminal in a drive mode and applying an external voltage exceeding said power-supply voltage to said output terminal in a high impedance mode, comprising:

a first MOS transistor having a source, a drain, a gate, and a back gate, with a current path between the source and the drain being connected between a power-supply voltage terminal and said output terminal;

a second MOS transistor of the same conductivity type as said first MOS transistor, having a source, a drain, a gate, and a back gate, with a current path between the source and the drain being connected between said back gate of said first MOS transistor and said gate of first MOS transistor, and said back gate of said second MOS transistor being connected with said back gate of said first MOS transistor;

a first control circuit having a first control signal output terminal for providing a control signal with said gate of said first MOS transistor;

a third MOS transistor of the same conductivity type as said first MOS transistor, having a source, a drain, a gate, and a back gate, with a current path between the source and the drain being coupled between said first control signal output terminal of said first control circuit and said gate of said first MOS transistor, and said back gate of said third MOS transistor being connected with said back gate of said first MOS transistor;

a fourth MOS transistor of the same conductivity type as said first MOS transistor, having a source, a drain, a gate, and a back gate, with a current path between the source and the drain being connected between said output terminal and said gate of said third MOS transistor, and said back gate of said fourth MOS transistor being connected with said back gate of said first MOS transistor; and a second control circuit for supplying a control voltage to said gates of said second and fourth MOS transistors;

wherein when an external voltage higher than said power-supply voltage is applied to said output terminal in a high impedance mode, said second control circuit supplies to gates of said second and fourth MOS transistors said control voltage having a value varying in an analogue relationship with said external voltage within a range of values lower than said power-supply voltage, and turns on said second and fourth MOS transistors, so that a potential difference between said output terminal and said gate of said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third MOS transistor, and a voltage at said back gate of said first MOS transistor to be transmitted to said gate of said first MOS transistor, wherein said second control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a fifth MOS transistor of the sane conductivity type as said first MOS transistor, having a source, a drain, a gate, and a back gate, with a current path between the source and the drain being connected between said power-supply voltage terminal and said control voltage output terminal of said second control circuit, and the gate being supplied with a first control input signal;

a sixth MOS transistor of the same conductivity type as said first MOS transistor, having a source, a drain, a gate, and a back gate, with a current path between the source and the drain being connected between said control voltage output terminal of said second control circuit and said first reference potential terminal and the gate being supplied with said first reference potential terminal;

a seventh MOS transistor of a conductivity type opposite to that of the first MOS transistor, having a source, a drain, a gate, and a back gate, with a current path between the source and the drain being connected in series with said current path of said sixth MOS transistor, and the gate being supplied with said fist control input signal;

an eighth MOS transistor of a conductivity type opposite to that of the first MOS transistor, having a source, a drain, a gate, and a back gate, with a current path between the source and the drain being connected between said power-supply voltage terminal and said control voltage output terminal of said second control circuit, and the gate being connected with said output terminal to which an external voltage higher than said power-supply voltage can be applied; and a ninth MOS transistor of a conductivity type opposite to that of the first MOS transistor, having a source, a drain, a gate, and a back gate, with a current path between the source and the drain being connected in parallel with said current path of said sixth MOS transistor, and the gate being supplied with the output signal of said signal inversion circuit.

32. The second control circuit according to claim 31, wherein a ratio of driving force of said sixth and seventh MOS transistors being connected in series, to that of said eighth MOS transistor is adjusted so that a potential difference between said gate of said first MOS transistor and said current path of said first MOS transistor may be within a desired range of values.

33. A driver circuit which is supplied with a power-supply voltage and is capable of driving an output terminal in a drive mode and applying an external voltage exceeding said power-supply voltage to said output terminal in a high impedance mode, comprising:

a first MOS transistor having a source, a drain, a gate, and a back gate, with a current path between the source and the drain being connected between a power-supply voltage terminal and said output terminal;

a second MOS transistor of the same conductivity type as said first MOS transistor, having a source, a drain, a gate, and a back gate, with a current path between the source and the drain being connected between said back gate of said first MOS transistor and said gate of first MOS transistor, and said back gate of said second MOS transistor being connected with said back gate of said first MOS transistor;

a first control circuit having a first control signal output terminal for providing a control signal with said gate of said first MOS transistor;

a third MOS transistor of the same conductivity type as said first MOS transistor, having a source, a drain, a gate, and a back gate, with a current path between the source and the drain being coupled between said first control signal output terminal of said fist control circuit and said gate of said first MOS transistor, and said back gate of said third MOS transistor being connected with said back gate of said first MOS transistor;

a fourth MOS transistor of the same conductivity type as said first MOS transistor, having a source, a drain, a gate, and a back gate, with a current path between the source and the drain being connected between said output terminal and said gate of said third MOS transistor, and said back gate of said fourth MOS transistor being connected with said back gate of said first MOS transistor; and a second control circuit for supplying a control voltage to said gates of said second and fourth MOS transistors;

wherein when an external voltage higher than said power-supply voltage is applied to said output terminal in a high impedance mode, said second control circuit supplies to said gates of said second and fourth MOS transistors said control voltage having a value varying in an analogue relationship with said external voltage within a range of values lower than said power-supply voltage, and turns on said second and fourth MOS transistors, so that a potential difference between said output terminal and said gate of said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third MOS transistor, and a voltage at said back gate of said first MOS transistor to be transmitted to said gate of said first MOS transistor, wherein said second control circuit comprises:

a control voltage output terminal outputting said control voltage;

a first reference potential terminal having a lower potential than said power-supply voltage;

a signal inversion circuit having an input node and an output node, said input node being connected with said output terminal to which an eternal voltage higher than said power-supply voltage can be applied;

a fifth MOS transistor of the same conductivity type as said first MOS transistor, having a source, a drain, a gate, and a back gate, with a current path between the source and the drain being connected between said power-supply voltage terminal and said control voltage output terminal of said second control circuit, and the gate being supplied with a first control input signal;

a resistor element having a current path being connected between said control voltage output terminal of said second control circuit and said first reference potential terminal;

a sixth MOS transistor of a conductivity type opposite to that of said first MOS transistor, having a source, a drain, a gate, and a back gate, with a current path between the source and the drain being connected in series with said resistor element, and the gate being supplied with said first control input signal;

a seventh MOS transistor of a conductivity type opposite to that of the first MOS transistor, having a source, a drain, a gate, and a back gate, with a current path between the source and the drain being connected between said power-supply voltage terminal and said control voltage output terminal of said second control circuit, and the gate being supplied with said output terminal to which an external voltage higher than said power-supply voltage can be applied; and an eighth MOS transistor of a conductivity type opposite to that of the first MOS transistor, having a source, a drain, a gate, and a back gate, with a current path between the source and the drain being connected in parallel with said current path of said resistor element, and the gate being connected with said output signal of said signal inversion circuit.

34. The second control circuit according to claim 33, wherein a ratio of driving force of said resistor element and said sixth MOS transistor being connected in series, to that of said seventh MOS transistor is adjusted so that a potential difference between said gate of said first MOS transistor and said current path of said first MOS transistor may be within a desired range of value.

35. A driver circuit which is supplied with a power-supply voltage and is capable of driving an output terminal in a drive mode and applying an external voltage exceeding said power-supply voltage to said output terminal in a high impedance mode, comprising:

a first MOS transistor having a source, a drain, a gate, and a back gate, with a current path between the source and the drain being connected between a power-supply voltage terminal and said output terminal;

a second MOS transistor of the same conductivity type as said first MOS transistor having a source, a drain, a gate, and a back gate, with a current path between the source and the drain being connected between said back gate of said first MOS transistor and said gate of first MOS transistor, and said back gate of said second MOS transistor being connected with said back gate of said first MOS transistor;

a first control circuit having a first control signal output terminal for providing a control signal with said gate of said first MOS transistor;

a third MOS transistor of the same conductivity type as said first MOS transistor, having a source, a drain, a gate, and a back gate, with a current path between the source and the drain being coupled between said first control signal output terminal of said first control circuit and said gate of said first MOS transistor, and said back gate of said third MOS transistor being connected with said back gate of said first MOS transistor;

a fourth MOS transistor of the same conductivity type as said first MOS transistor, having a source, a drain, a gate, and a back gate, with a current path between the source and the drain being connected between said output terminal and said gate of said third MOS transistor, and said back gate of said fourth MOS transistor being connected with said back gate of said first MOS transistor; and a second control circuit for supplying a control voltage to said gates of said second and fourth MOS transistors;

wherein when an external voltage higher than said power-supply voltage is applied to said output terminal in a high impedance mode, said second control circuit supplies to said gates of said second and fourth MOS transistors said control voltage having a value varying in an analogue relationship with said external voltage within a range of values lower than said power-supply voltage, and turns on said second and fourth MOS transistors, so that a potential difference between said output terminal and said gate of said second MOS transistor is higher than an absolute value of a threshold voltage of said second MOS transistor, and that a potential difference between said output terminal and said gate of said fourth MOS transistor is higher than an absolute value of a threshold voltage of said fourth MOS transistor, thereby permitting said external voltage at said output terminal to be transmitted to said gate of said third MOS transistor, and a voltage at said back gate of said first MOS transistor to be transmitted to said gate of said first MOS transistor, wherein said second control circuit comprises:

a control voltage output terminal outputting said control voltage;

a first reference potential terminal having a lower potential than said power-supply voltage;

a signal inversion circuit having an input node and an output node, said input node being connected with said output terminal to which an external voltage higher than said power-supply voltage can be applied;

a fifth MOS transistor of the same conductivity type as said first MOS transistor, having a source, a drain, a gate, and a back gate, with a current path between the source and the drain being connected between said power-supply voltage terminal and said control voltage output terminal of said second control circuit, and the gate being supplied with a first control input signal;

a sixth MOS transistor of a conductivity type opposite to that of said first MOS transistor, having a source, a drain, a gate, and a back gate, with a current path between the source and the drain being connected between said control voltage output terminal of said second control circuit and said first reference potential voltage terminal, and the gate being supplied with said power-supply voltage;

a seventh MOS transistor of a conductivity type opposite to that of the first MOS transistor, having a source, a drain, a gate, and a back gate, with a current path between the source and the drain being connected in series with said current path of said sixth MOS transistor, and the gate being supplied with said first control input signal;

an eighth MOS transistor of a conductivity type opposite to that of the first MOS transistor, having a source, a drain, a gate, and a back gate, with a current path between the source and the drain being connected between said power-supply voltage terminal and said control voltage output terminal of said second control terminal, and the gate being connected with said output terminal to which an external voltage exceeding said power-supply voltage can be applied; and a ninth MOS transistor of a conductivity type opposite to that of the first MOS transistor, having a source, a drain, a gate, and a back gate, with a current path between the source and the drain being connected in parallel with said current path of said sixth MOS transistor, and the gate being supplied with the output of said signal inversion circuit.

36. The second control circuit according to claim 35, wherein a ratio of driving force of said sixth and seventh MOS transistors being connected in series, to that of said eighth MOS transistor is adjusted so that a potential difference between said gate of said first MOS transistor and said current path of said first MOS transistor may be within a desired range of value.

37. A semiconductor integrated circuit comprising:

a power-supply voltage terminal for supplying a power-supply voltage;

an output terminal for receiving an external voltage;

a first MOS transistor having a source, a drain, a gate, and a back gate, one of the source and the drain of said first MOS transistor being connected to said output terminal; and a second MOS transistor of a conductivity type opposite to that of said first MOS transistor, said second MOS transistor having a source, a drain, a gate, and a back gate, one of the source and the drain of said second MOS transistor being connected to said power-supply voltage terminal, the other one of the source and the drain of said second MOS transistor being connected to the gate of said first MOS transistor, the gate of said second MOS transistor being connected to said output terminal, wherein said second MOS transistor, responsive to the external voltage being higher than the power-supply voltage, supplies to the gate of said first MOS transistor a control voltage having a value varying with the external voltage and within a range of values lower than the power-supply voltage, and turns on said first MOS transistor, thereby permitting the external voltage to be transmitted to the other of the source and the drain of said first MOS transistor.

38. A driver circuit comprising:

a power-supply voltage terminal for supplying a power-supply voltage;

an output terminal for receiving an external voltage;

a first MOS transistor having a source, a drain, and a back gate, one of the source and the drain of said first MOS transistor being connected to said power-supply voltage terminal, the other one of the source and the drain of said first MOS transistor being connected to said output terminal;

a second MOS transistor of the same conductivity type as said first MOS transistor, said second MOS transistor having a source, a drain, a gate, and a back gate, one of the source and the drain of said second MOS transistor being connected to the back gate of said first MOS transistor, the other one of the source and the drain of said second MOS transistor being coupled to the gate of said first MOS transistor, the back gate of said second MOS transistor being connected to the back gate of said first MOS transistor;

a third MOS transistor of the same conductivity type as said first MOS transistor, said third MOS transistor having a source, a drain, a gate, and a back gate, one of the source and the drain of said third MOS transistor being connected to said power-supply voltage terminal, the other one of the source and the drain of said third MOS transistor being coupled to the gate of said first MOS transistor, the back gate of said third MOS transistor being connected with the back gate of said first MOS transistor;

a fourth MOS transistor of the same conductivity type as that of said first MOS transistor, said fourth MOS transistor having a source, a drain, a gate, and a back gate, one of the source and the drain of said fourth MOS transistor being connected to said output terminal, the other one of the source and the drain of said fourth MOS transistor being connected to the gate of said third MOS transistor, the back gate of said fourth MOS transistor being connected with the back gate of said first MOS transistor; and a fifth MOS transistor of a conductivity type opposite to that of said first MOS transistor, said fifth MOS transistor having a source, a drain, a gate, a back gate, one of the source and the drain of said fifth MOS transistor being connected to the power-supply voltage, the other one of the source and the drain of said fifth MOS transistor being connected to the gates of both said second and fourth MOS transistors, the gate of said fifth MOS transistor being connected to said output terminal, wherein said fifth MOS transistor, responsive to the external voltage being higher than the power-supply voltage, supplies to the gate of each of said second and fourth MOS transistors a control voltage having a value varying with said external voltage and within a range of values lower than said power-supply voltage, and turns on said second and fourth MOS transistors, thereby permitting the external voltage to be transmitted to the gate of said third MOS transistor and a voltage at the back gate of said first MOS transistor to be transmitted to the gate of said first MOS transistor.

* * * * *

UNITED STATES PATENT AND TRADEMARK OFFICE
CERTIFICATE OF CORRECTION

PATENT NO.   : 6,084,431
DATED        : July 4, 2000
INVENTOR(S)  : Hiroshi Shigehara et al.

It is certified that error appears in the above-identified patent and that said Letters Patent is hereby corrected as shown below:

Title page,
References Cited [56], under Foreign Patent Documents:
"82258101A" has been replaced with -- 2258101A --.

Claim 7, column 18,
Line 59, "sate" has been replaced with -- gate --.

Claim 11, column 20,
Line 49, -- , a -- has been inserted after the word "source".

Claim 18, column 22,
Line 31, -- first -- has been inserted after the word "said".

Claim 24, column 27,
Line 12, "and" has been removed.

Claim 31, column 29,
Line 45, "sane" has been replaced with the word -- same --;

Claim 33, column 31,
Line 23, "eternal" has been replaced with -- external --.

Signed and Sealed this

Twenty-third Day of October, 2001

*Attest:*

NICHOLAS P. GODICI
*Attesting Officer*   *Acting Director of the United States Patent and Trademark Office*